(12) United States Patent
Herdt et al.

(10) Patent No.: US 9,740,799 B2
(45) Date of Patent: Aug. 22, 2017

(54) CUT-FOLD SHAPE TECHNOLOGY FOR ENGINEERED MOLDED FIBER BOARDS

(75) Inventors: Julee Ann Herdt, Boulder, CO (US); Kellen Scott Schauermann, Longmont, CO (US); John F. Hunt, Mount Horeb, WI (US)

(73) Assignees: The Regents of the University of Colorado, a Body Corporate, Denver, CO (US); The United States of America as Represented by the Secretary of Agriculture, Washington, DC (US)

( * ) Notice: Subject to any disclaimer, the term of this patent is extended or adjusted under 35 U.S.C. 154(b) by 1114 days.

(21) Appl. No.: 13/991,092

(22) PCT Filed: Dec. 2, 2011

(86) PCT No.: PCT/US2011/063134
§ 371 (c)(1),
(2), (4) Date: May 31, 2013

(87) PCT Pub. No.: WO2012/075430
PCT Pub. Date: Jun. 7, 2012

(65) Prior Publication Data
US 2013/0253683 A1    Sep. 26, 2013

Related U.S. Application Data

(60) Provisional application No. 61/419,547, filed on Dec. 3, 2010.

(51) Int. Cl.
G06F 17/50 (2006.01)
B29C 53/06 (2006.01)
B29K 105/08 (2006.01)

(52) U.S. Cl.
CPC ............ *G06F 17/50* (2013.01); *B29C 53/063* (2013.01); *B29K 2105/08* (2013.01)

(58) Field of Classification Search
CPC .... G06F 17/50; B29C 53/063; B29K 2105/08
(Continued)

(56) References Cited

U.S. PATENT DOCUMENTS 1,649,577 A    11/1927 Coryell
2,101,090 A    12/1937 Vincent
(Continued)

OTHER PUBLICATIONS

Hunt, "3D Engineered Fiberboard: Finite Element Analysis of a New Building Product", publisher ResearchGate, May 26, 2004, pp. 1-21.*

(Continued)

*Primary Examiner* — Miranda Huang
*Assistant Examiner* — Olvin Lopez Alvarez
(74) *Attorney, Agent, or Firm* — Dorsey & Whitney LLP

(57) ABSTRACT

A three-dimensional engineered shaped fiber configuration is formed using determined structural requirements for a three-dimensional engineered shaped fiber configuration and ascertained properties of an engineered molded fiber fiberboard material. A first cut on a top surface and a second cut on a bottom surface of the fiberboard material are calculated. These calculations are based, at least in part, on the structural requirements properties of the fiberboard material. The first cut and the second cut each have a depth, a width, and a position. The first cut and the second cut have a spacing between them such that the flat piece of fiberboard material can be folded at a point located in the spacing between the first cut and second cut to position a first portion of the fiberboard material at a particular angle with respect to a second portion of the fiberboard material.

6 Claims, 29 Drawing Sheets

(58) Field of Classification Search
USPC .......................................... 700/98; 428/34.2
See application file for complete search history.

(56) References Cited

U.S. PATENT DOCUMENTS

| | | | |
|---|---|---|---|
| 2,752,032 A * | 6/1956 | Fish | B65D 85/185 206/279 |
| 2,991,855 A | 7/1961 | Buell et al. | |
| 3,397,497 A | 8/1968 | Shea et al. | |
| 3,657,849 A | 4/1972 | Garton | |
| 3,759,193 A * | 9/1973 | Branch | B65D 19/0097 108/53.3 |
| 3,812,636 A | 5/1974 | Albrecht et al. | |
| 4,037,379 A | 7/1977 | Ozanne | |
| 4,453,364 A | 6/1984 | Ting | |
| 4,490,958 A | 1/1985 | Lowe | |
| 4,885,892 A | 12/1989 | Gooding | |
| 5,165,213 A | 11/1992 | Finch et al. | |
| 5,707,474 A * | 1/1998 | Andersen | B01F 3/1214 156/257 |
| 5,771,645 A | 6/1998 | Porter | |
| 5,830,548 A | 11/1998 | Andersen et al. | |
| 6,144,896 A * | 11/2000 | Kask | G06T 19/00 700/165 |
| 6,167,624 B1 | 1/2001 | Lanahan et al. | |
| 6,219,586 B1 * | 4/2001 | Sakai | G05B 19/4097 700/165 |
| 6,260,323 B1 | 7/2001 | Hockey | |
| 6,324,438 B1 | 11/2001 | Cormier et al. | |
| 8,028,483 B2 | 10/2011 | Carolan | |
| D652,956 S | 1/2012 | Tanaka et al. | |
| 8,393,129 B2 | 3/2013 | Arsene et al. | |
| 2002/0088199 A1 | 7/2002 | Linn | |
| 2003/0029133 A1 | 2/2003 | Czachor et al. | |
| 2003/0041547 A1 | 3/2003 | Gosselin | |
| 2004/0074206 A1 | 4/2004 | Tanase et al. | |
| 2005/0005670 A1 * | 1/2005 | Durney | B21D 11/20 72/379.2 |
| 2006/0200269 A1 | 9/2006 | Saarela et al. | |
| 2007/0165037 A1 | 7/2007 | Ryu et al. | |
| 2008/0241487 A1 | 10/2008 | Tomes et al. | |
| 2008/0281459 A1 * | 11/2008 | Liu | G05B 19/40937 700/165 |
| 2009/0255205 A1 * | 10/2009 | Noble | B32B 3/10 52/630 |
| 2009/0278843 A1 * | 11/2009 | Evans | G06F 17/50 345/419 |
| 2010/0078985 A1 * | 4/2010 | Mahoney | B32B 3/10 297/446.1 |
| 2011/0099927 A1 | 5/2011 | Garcia Viar | |
| 2011/0113725 A1 | 5/2011 | Garry | |
| 2012/0085062 A1 | 4/2012 | Neumayr | |
| 2013/0080286 A1 * | 3/2013 | Rotholz | A47C 5/005 705/26.5 |

OTHER PUBLICATIONS

Ma et al, "A Design Database for Moulded Pulp Packaging Structure", 2004, pp. 193-204.*
Hunt et al, "3D Engineered Fiberboard: A New Structural Building Product", Proceedings of the Sixth Panel Products Symposium : Oct. 11, 2002, pp. 106-117.*
International Search Report and Written Opinion for PCT/US2011/063134 (Apr. 10, 2012).

* cited by examiner

AFTER FOLD (UP)　　　　BEFORE FOLD　　　　AFTER FOLD (DOWN)

EXPLODED VIEW

ASSEMBLED VIEW

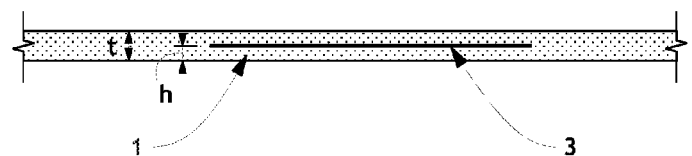
SECTION CUT @ FLAT POSITION
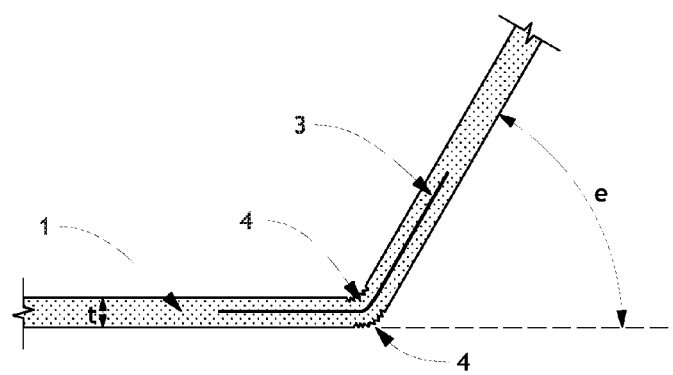
SECTION CUT @ FOLDED POSITION
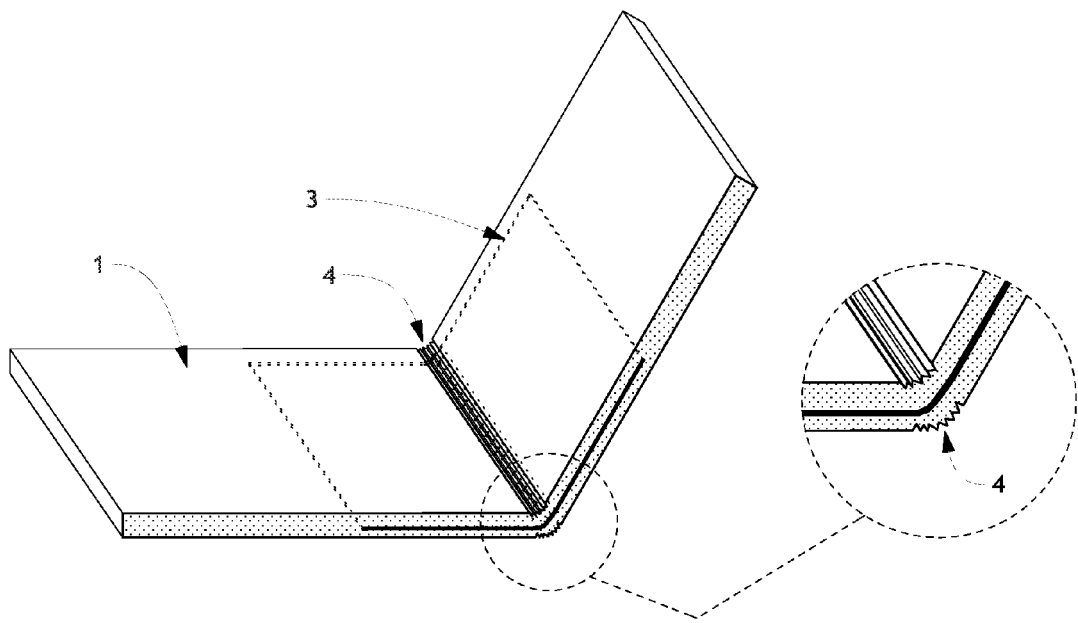
AXONOMETRIC @ FOLDED POSITION
FIG. 12

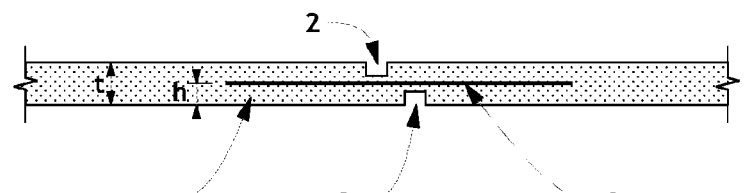
SECTION CUT @ FLAT POSITION
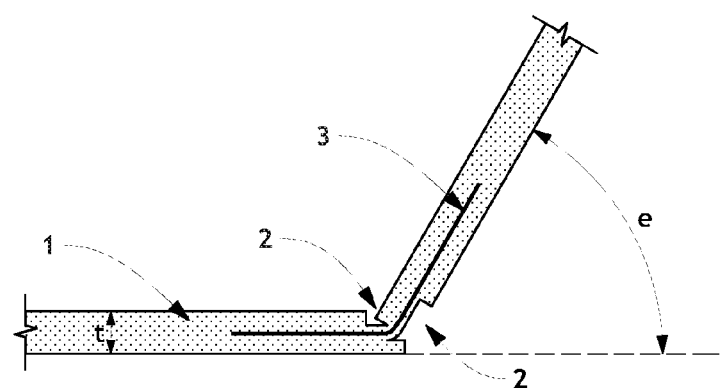
SECTION CUT @ FOLDED POSITION
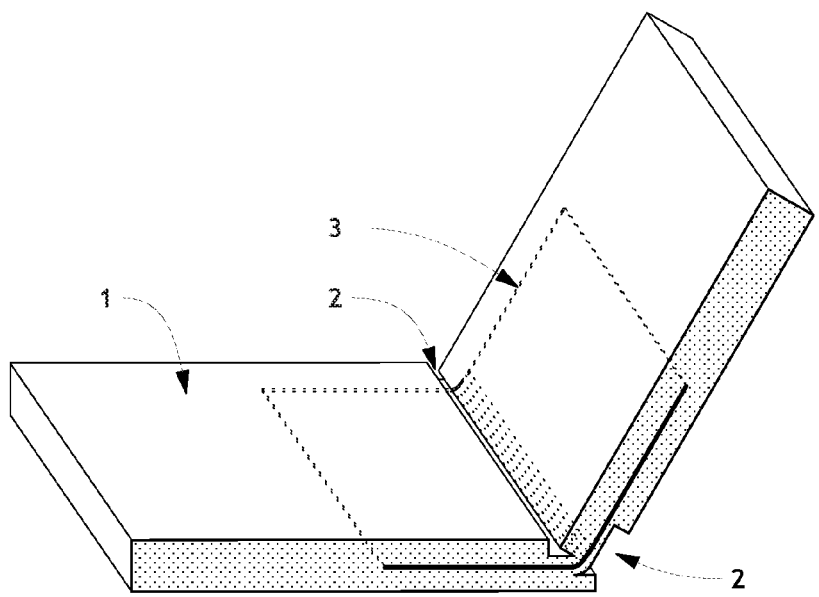
AXONOMETRIC @ FOLDED POSITION
FIG. 13

FIG. 21A

| SUBSTRATE NAME: | 6" BioSIP w/ 8" o.c. core pattern | | | | DATE: | 8/6/2010 | | |
|---|---|---|---|---|---|---|---|---|

| CORE PROPERTIES ||||||||||
|---|---|---|---|---|---|---|---|---|---|
| Construction Module | Pattern Width | Rib Angle | Face Thickness | Rib Thickness | Core Height | Panel Width | Usable Area within panel core || Load Transfer to Faces |
| 2W | W | α | B | t | C | B + C + B | | | |
| Inch (o.c.) | Inch | Degrees | Inch | Inch | inch | inch | % | s.f. | % |
| 16 | 8 | 90 | 0.125 | 0.125 | 5.750 | 6.000 | 98.44 | 1.89 | 25 |
| Panel Length | Panel Height | Corrugated Core | Face Panels | Nestable | Plate Size | Panel Area | Nailable Surface Area per panel face || Additional Safety |
| inch | inch | No. | No. | | | ft^2 | % | s.f. | % |
| 48 | 96 | 1 | 2 | No | | 32.00 | 50.78 | 16.25 | 60 |

| CONSTITUTIVE PROPERTIES ||||
|---|---|---|---|
| | Core | Face | Foam Insulation ||
| Bending Modulus | 966,825 psi | 966,825 psi | Thermal Conductivity | r-value per 7.25 inch | Thermal Resistance of BioSIP assembly |
| Density | 65.19 lb/ft^3 | 65.19 lb/ft^3 | Foam Density | 2.3 pcf | 36.7 r-value |
| Compressive Strength | 5,000 psi | 5,000 psi | Compressive Strength | 35 psi | Percent of total possible R-Value |
| Press Pressure | 250 psi | 250 psi | Modulus, MOE | 790 psi | 91.4 % |
| Resin | 1 % | 1 % | Shear Modulus | 325 psi | Insulation Weight |
| Chemical | 0 % | 0 % | Tensile Modulus | 325 psi | 33.96 lbs |

| STRUCTURAL PROPERTY ESTIMATES |||||||
|---|---|---|---|---|---|---|
| Axial Loading |||| Transverse Loading |||
| Ultimate Load & Deflection | 56,489 lbs | >44,000 lbs | Pass | Ultimate Load & Deflection | 7,963 lbs | >6,400 lbs | Pass |
| | 14,122 plf | | | | 249 psf | | |
| | -0.250 inch | | | | -1.500 inch | | |
| Max Load / SF | 14,122 lbs | Design Load || L/360 = .250" | 1,327 lbs | > 890 lbs | Pass |
| H/800 = .120" | 27,115 lbs | - || L/240 = .375" | 1,991 lbs | > 1350 lbs | Pass |
| Allowable Load | 14,122 lbs | > 12,500 lbs | Pass | L/180 = .500" | 2,654 lbs | > 1871 lbs | Pass |
| Load/Weight | 493.7 lb/lb | Safety Factor = 4 || Load/Weight | 69.6 lb/lb | Safety Factor = 4 ||
| Load/Cost | 422.8 lb/$ | | | Load/Cost | 59.6 lb/$ | | |

| COST ESTIMATES ||| EMF PRODUCTION ESTIMATES (batch runs) |||
|---|---|---|---|---|---|
| EMF COGS | $4.75 /panel | $0.15 /s.f. | Press Openings | 12 | 92 panels/hour |
| EMF Price | $7.68 /panel | $0.24 /s.f. | 8-hr Shifts / Day | 1 | 732 panels/day |
| EMF Core+Skin | $21.63 /panel | $0.68 /s.f. | Work Days / Year | 64 | 14,647 panels/month |
| SIP Mfr Cost | $111.97 /panel | $3.50 /s.f. | production in batch runs: || 46,871 panels/year |
| BioSIP COGS | $133.60 /panel | $4.17 /s.f. | Annual EMF Production || 1,499,869 square feet |
| BioSIP Price | $256.00 /panel | $8.00 /s.f. | Annual BioSIP Production || 245,760 square feet |

| WEIGHT & RECYCLED WASTER FIBER INPUTS ||||||||
|---|---|---|---|---|---|---|---|
| Panel Weight | 114.4 lbs | < 135.3 lbs, weight of standard SIP |||| Fiber Type | Core | Face |
| | 3.58 lbs/s.f. | 15.4% less weight than a standard SIP |||| OCC | 100.00% | 100.00% |
| Diverted Waste | 80.5 lbs/panel | 70.3% of total panel is from recycled waste |||| ONP | 0.00% | 0.00% |
| | 5.1 tons/house (2400 s.f.) | 35 ft tall trees | cubic yards of landfill space | barrels oil | Pine | 0.00% | 0.00% |
| | 60 houses/year ||||| Bovine | 0.00% | 0.00% |
| | 309.0 tons/year | = | 5,253 | 989 | 618 | Other | 0.00% | 0.00% |

FIG. 22A

| INFORMATION FOR WASTE DIVERSION CALCULATIONS & FACTOIDS: |||
|---|---|---|
| Data for one BioSIP panel: |||
| *from BioSIP 3DEF software* |||
| Panel Type: | 6" BioSIP w/ 8" o.c. core pattern ||
| Panel Size: | 32.00 s.f. ||
| Panel Weight | 114.4 lbs | < 135.3 lbs, weight of standard SIP |
| | 3.58 lbs/s.f. | 15.4% less weight than a standard SIP |
| Diverted Waste | 80.5 lbs/panel | 70.3% of total panel is from recycled waste |
| Waste diversion from one BioSIP home: |||
| *Based on "Data for one BioSIP panel" above* |||
| 1 | house (2 story, 2400 s.f. w/ a 30'x40' footprint) ||
| 10,299 | lbs/house ||
| 5.1 | tons/house ||
| Environmental benefits of one BioSIP home: |||
| *Based on the recycling data from below & waste diversion data above* |||
| 88 | 35 ft tall trees ||
| 36,048 | Gallons of water ||
| 10 | barrels of oil ||
| 6,489 | (enough to run the avg. car for _____ miles) ||
| 21,114 | kilowatts of energy ||
| 31 | (enough to power the average home for _____ months) ||
| 309 | lbs of air pollution ||
| 16 | cubic yards of landfill space ||
| Waste diversion from producing: | 60 BioSIP homes per year ||
| *Based on "Data for one BioSIP panel" above* |||
| 617,963 | lbs/year ||
| 309.0 | tons/year ||
| Environmental benefits of producing: | 60 BioSIP homes per year ||
| *Based on the recycling data from below & waste diversion data above* |||
| 5,253 | 35 ft tall trees ||
| 2,162,872 | Gallons of water ||
| 618 | barrels of oil ||
| 389,317 | (enough to run the avg. car for _____ miles) ||
| 1,266,825 | kilowatts of energy ||
| 1,854 | (enough to power the average home for _____ months) ||
| 18,539 | lbs of air pollution ||
| 989 | cubic yards of landfill space ||
| Recycling 1 ton of corrugated cardboard saves: |||
| 17 | 35 ft tall trees ||
| 7,000 | Gallons of water ||
| 2 | barrels of oil ||
| 1,260 | (enough to run the avg. car for _____ miles) ||
| 4,100 | kilowatts of energy ||
| 6 | (enough to power the average home for _____ months) ||
| 60 | lbs of air pollution ||
| 3.2 | cubic yards of landfill space ||
| Sources: | American Forest and Paper Association ||
| | EcoCycle website ||
| | Trash to Cash ||

Text Key: Numbers in RED are user inputs; Numbers in BLUE are referenced values; Numbers in BLACK are calculated values

FIG. 22B

| ADDITIONAL INFORMATION FOR WASTE DIVERSION CALCULATIONS: | | | | | |
|---|---|---|---|---|---|
| Weight of one EMF sheet = | 21.73 lbs | | Size: | 48"x96" | 32.00 s.f. |
| EMF sheets per BioSIP (core + skins) | 3.70 EMF sheets per BioSIP | | | | |
| Weight of BioSIP (core + skins) fiber | 80.5 lbs | | Size: | 48"x96"X6" | 32.00 s.f. |
| EMF for BioSIP fabrication | 910,080 s.f | | 617,963 lbs / year | | 309 tons / year |
| EMF production for BioBoard Sales | 589,789 s.f | | 400,479 lbs / year | | 200 tons / year |

FORMULAS FOR CALCULATIONS: (NOT CURRENTLY BEING USED)

| COST ESTIMATES | | | EMF PRODUCTION ESTIMATES (4'x8' panels) | | |
|---|---|---|---|---|---|
| Profit | $122.40 /panel | $3.83 /s.f. | Press Openings | 12 | 25 panels/hour |
| | | | 8-hr Shifts / Day | 1 | 198 panels/day |
| | | | Work Days / Year | 64 | 3,955 panels/month |
| | | | | | 12,657 panels/year |
| | | | Annual BioSIP Production | | 405,028 square feet* |
| | | | Annual BioSIP Production | | 245,760 square feet |

| Diverted Waste | 80.5 | lbs/panel | *These totals are based on assuming that all EMF sheets are used for BioSIP production* |
|---|---|---|---|
| | 5.1 | tons/house (2400 s.f.) | |
| | 99 | houses/year* | |
| | 509 | tons/year* | |

CUT-FOLD SHAPE TECHNOLOGY FOR ENGINEERED MOLDED FIBER BOARDS

TECHNICAL FIELD

The disclosed embodiments relate generally to fiberboard materials, and more particularly to cut, fold, shape technology for producing three-dimensional engineered shaped fiber configurations using engineered molded fiber.

BACKGROUND

Structural building panels have long been used to facilitate modular construction of buildings. The use of structural building panels facilitates the rapid construction of buildings because these prefabricated panels reduce onsite construction time. In order to increase thermal efficiency of structures constructed from structural building panels, while yielding thermally-sound building systems, insulation may be incorporated with the building panels. The incorporation of insulation provides a structured insulated panel, or "SIP." Structural insulated building panels are often used in construction; however, such currently existing SIPs suffer from various deficiencies.

For example, standard structural insulated building panels (SIPs) are of a stressed-skin panel design. The structural members (i.e., the skins) form a shell that encapsulates and is often glued to the insulation. Most of the stress on the panels is borne by this structural shell. This is not the most efficient means of bearing stress because it results in material redundancy and waste, increased labor and shipping expenses, and an overall low strength-to-weight ratio. Many stressed-skin SIPs are fabricated using oriented strand board ("OSB") as their outer skins. OSB is manufactured using materials including chemicals that damage the environment and the health of living organisms. Additionally, OSB stressed-skin panels have limited flexibility in their application due to their rigidity and two-dimensional flat sheet configuration. Using OSB as an outer SIP surfacing material presents difficulties with incorporating and integrating construction components, for example, conduit and wiring, plumbing, and framing members into and through the OSB surface. Further, many OSB stressed-skin panels offer limited aesthetic possibilities due to the non-flexible nature of OSB, its unappealing appearance, and because OSB should be covered or encapsulated and not left exposed as a finish material because gasses from the aforementioned chemicals may leach into the living environment.

Contrary to two-dimensional stressed-skin SIPs, three-dimensional SIPs may be created by combining a 3D engineered molded fiber (EMF) core that is insulated and has one or more stressed-skins, allowing for achievement of a variety of SIP configurations and resulting building shapes. However, in order to create three-dimensional EMF shapes of different thicknesses, generally a new mold would be required every time a different SIP shape change is desired, even for the most minor incremental modification. This makes economical application of current three-dimensional EMF technology somewhat limited to production of planar and simply curved forms. Mold-making, therefore, is the most expensive step in current three-dimensional EMF fabrication. EMF molds may be expensive to make, may be expendable, and may have to be replaced over time due to wear. Cut-Fold-Shape technology offers a structurally-enhanced, more efficient- and cost effective method for producing a virtually limitless variety of three-dimensional EMF shapes for SIP, furniture, and other fields-of-use.

The information included in this Background section of the specification, including any references cited herein and any description or discussion thereof, is included for technical reference purposes only and is not to be regarded subject matter by which the scope of the disclosure is to be bound.

SUMMARY

In one implementation, the technology disclosed herein is a method for forming a three-dimensional engineered shaped fiber configuration. A plurality of structural requirements for a three-dimensional engineered shaped fiber configuration is determined. A plurality of properties of at least one engineered molded fiber fiberboard material is also ascertained. A first cut on a top surface of a flat piece of engineered molded fiber fiberboard material and a second cut on a bottom surface of the flat piece of the engineered molded fiber fiberboard material are calculated. These calculations are based, at least in part, on the plurality of structural requirements for the three-dimensional engineered shaped fiber configuration and the plurality of properties of the at least one engineered molded fiber fiberboard material. The first cut and the second cut each have a depth, a width, and a position. The first cut and the second cut have a spacing between them such that the flat piece of the engineered molded fiber fiberboard material can be folded at a point located in the spacing between the first cut and second cut to position a first portion of the flat piece of the engineered molded fiber fiberboard material at a particular angle with respect to a second portion of the flat piece of the engineered molded fiber fiberboard material.

In one implementation, the technology disclosed herein is in the form of a computer program product with several sets of instructions stored in a non-transitory storage medium executable by at least one processing unit. A first set of instructions is provided to determine a plurality of structural requirements for a three-dimensional engineered shaped fiber configuration. A second set of instructions is provided to ascertain a plurality of properties of at least one engineered molded fiber fiberboard material. A third set of instructions is provided to calculate a first cut on a top surface and a second cut on a bottom surface of a flat piece of engineered molded fiber fiberboard material based on, at least in part, the plurality of structural requirements for the three-dimensional engineered shaped fiber configuration and the plurality of properties of the engineered molded fiber fiberboard material. The first cut and the second cut each have a depth, a width, and a position. The first cut and the second cut have a spacing between them such that the flat piece of the engineered molded fiber fiberboard material can be folded at a point located in the spacing between the first cut and second cut to position a first portion of the flat piece of the engineered molded fiber fiberboard material at a particular angle with respect to a second portion of the flat piece of the engineered molded fiber fiberboard material.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. A more extensive presentation of features, details, utilities, and advantages of the present invention as defined in the claims is provided in the following written description of various embodiments of the invention and illustrated in the accompanying drawings.

BRIEF DESCRIPTION OF THE DRAWINGS

FIGS. 12 and 13 are multiple views showing examples of a non-specified hinge material embedded in the EMF material so as to yield specific bending properties for a 3D ESF shape.

FIGS. 21A-21C are sample display screens that may be displayed by an exemplary implementation of the disclosed software.

FIGS. 22A-22C are sample display screens illustrating a sequence of results that may be displayed by an exemplary implementation of the disclosed software.

FIGS. 27 and 28 are sample display screens that may be generated by an exemplary implementation of the disclosed software determining the optimal cut-shape joint properties and cut-shape joint locations for fabrication for the exemplary three-dimensional SIP configuration.

DETAILED DESCRIPTION

Figure 1:
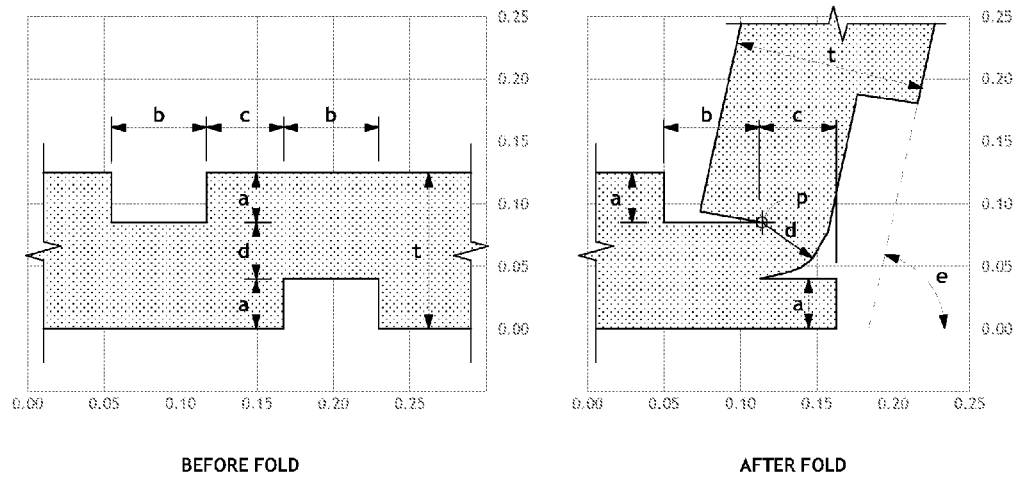
FIG. 1 is a detail drawing showing an exemplary Engineered Shaped Fiber (ESF) cross-section with depth of cut; width of cut; spacing between cuts; and with corresponding cuts on the opposite face of the EMF board. An ESF is an EMF fiberboard that has been given a three-dimensional configuration using cut-shape-fold technology.

The present disclosure describes a "Cut, Fold, and Shape" (CFS) technology for yielding three-dimensional Engineered Shaped Fiber (ESF) configurations that utilize smooth-face Engineered Molded Fiber (EMF) fiberboard materials to produce interlocking assemblies and geometries that may be suitable for such uses as building materials, industrial fabrication components, furniture, packaging, and other applications. Proprietary EMF materials as well as certain commercial fiberboards may be used to achieve ESF configurations. In this technology, constitutive EMF material properties are engineered concurrently with specific ESF cuts, indents, folds, and manipulations such that desired joints with predicted performance criteria may be achieved in three-dimensional fiberboard designs. Constitutive EMF fiberboard properties may be critical to the performance of resulting ESF shapes, structures, or products. ESF three-dimensional designs and configurations described herein may be created using computer-based computational processes and Computer Numerically Controlled (CNC) fabrication techniques or using hand-fabrication methods and standard tools such as a table saw or other.

The disclosed CFS technology may allow flat fiberboard materials to be manipulated into an unlimited range of material expanses and shapes such as uniform and non-uniform, orthogonal or non-orthogonal, simple or complex curves, and all combinations thereof. This may be accomplished using computer-computational design for joining fiberboard units with integral, engineered cuts of various shapes and characteristics. Three-dimensional ESF forms, shapes, and arrangements may be joined, reinforced, or otherwise enhanced using materials such as foam insulation, adhesives, concrete, metal connectors, carbon fiber materials, and so on. ESF fiberboard shapes may also be joined using friction-fit or integrated tabular connections. Hence, new three-dimensional EMF shapes may be created without the need for expensive fiber-forming molds and fabrication methods.

The ESF methods described herein offer various ESF fabrication advantages for structured insulated panels (SIP) and may be utilized to construct SIPs like those disclosed in U.S. Provisional Patent Application No. 61/497,340 filed Jun. 15, 2011, entitled "Structural Insulated Building Panel," which is incorporated herein by reference in its entirety. These ESF fabrication advantages may include: achievement of varying and varied-shaped, angled ribs ranging from flat to beyond perpendicular (0 up to 360 degrees) in order to produce ribs for SIP core shapes not previously attainable in wet fiber forming; production of SIP panels with improved structural and geometric characteristics when compared to three-dimensional wet-formed SIP panels for certain applications; ease-of-design and fabrication for custom SIP panels using digital fabrication adjustments that allow product precision combined with close design tolerances; easy adjustment of desired SIP corrugated core configurations for creation of new and next generation SIP products; production of a SIP panel core with multiple, geometrically-shaped core options; use of inserts in SIP fabrication to assist folding, locking, and holding panel cores in place, thus making the assembly process more efficient and at the same time for some applications eliminating the need for adhesives in securing the panel core with panel insulation (or other core filler); consideration of, and positioning of, geometric inserts to correspond with foaming hole positions within panel assembly to provide thoroughness in foaming (which may result in non-bending of SIP cores during fabrication as well as allowing for ideal foam dispersion); and others.

The ESF methods described herein may also be applied in the construction fields including, but not limited to the following building typologies: residential; commercial; industrial; educational; agricultural; movie theaters and entertainment; hospitality; medical; disaster, emergency, rapid deployment or other shelter structures; temporary structures; animal shelters; furniture and furnishings, screens and partitions; children's furniture and toys; ceiling, wall, and floor skins and surfaces; lighting; concrete formwork; SIPs and other panels and boards; aerospace; automotive; railway; displays and stage sets; and so on. Further, the described ESF methods may have application in the following: artist products and materials; electronics and computer industry goods; renewable energy equipment; hobby and craft materials; sports equipment and goods; packaging and containers; suitcases, trunks, handbags, and couture; food service; specialty products; "product-as-package" design in all fields of use; and so on.

The ESF methods described herein may allow patterns of engineered cuts with prescribed shape and dimension to be designed so as to impart strength, integral connection between elements, and other performance characteristics for three-dimensional fiberboard product design.

The engineered cuts may be positioned on the smooth surfaces of the EMF material to allow the material to be shifted out of the x-y axes positions, resulting in structural components with three-dimensional, planar (uniform), orthogonal, non-orthogonal, simple curves, or complex curve surface geometries, or combinations thereof. The cuts may completely penetrate the material or, they may be made partially into the material. The cuts may be made on opposing sides of the material, or they may be made on one side of the material only, or they may be made all the way through the material if also remaining connected to adjacent areas of the formerly-described cuts. Any of these manipulations may yield a variety of three-dimensional fiberboard shapes when the flat sheet is folded.

Further, as engineered cuts may also be positioned at the edges of the manipulated material, the cuts may provide integral connection points between sections of material. The integral connection points may be designed for use as hinges, tabs, and other shapes for holding the manipulated fiberboard material together in rigid or semi-rigid forms.

The engineered cuts positioned on the smooth surfaces or the edges of the EMF material may allow bonding connections between material units of varying size, scale, and fiber composition. The bonded units may have consistent, uninterrupted surface planes, or they may be designed with voids and openings between the units. Either of these strategies may be a function of prescriptive or performance design methods being applied to the engineered cuts through computational computer software inputs.

The described ESF method, especially in reference to the cutting and inserting of integrating (and integral) components, may allow for construction of continuous, connected forms that are unlimited in size and in potential for expansion.

This disclosure will first discuss the ESF method and various three-dimensional ESF configurations that the ESF method may yield. Subsequently, computer software for calculating computer-based computational processes and controlling CNC fabrication to perform the ESF method to yield three-dimensional ESF configurations will be discussed.

ESF Method and Three-Dimensional ESF Configurations

The ESF method and various three-dimensional ESF configurations that the ESF method may yield will now be discussed. In FIGS. 1A-1D, (t) corresponds to the flat panel thickness, (a) corresponds to the depth of cut from both the top and bottom sides of the EMF board, (b) corresponds to the width of cut or the width of the tool used for cutting, (i) corresponds the width of the indentation, (c) corresponds to the spacing between the top and bottom cuts, (d) corresponds to the remaining material through the thickness located between the top and bottom depth of cuts, and (e) corresponds to the rib angle of a desired three-dimensional ESF configuration.

FIG. 1 is a detail drawing showing an exemplary ESF cross-section with depth of cut (a); width of cut (b); spacing between cuts (c); and with corresponding cuts on the opposite face of the EMF board. Also shown is a pivot point (p) and the degree of the ESF angle (e). Radius (d) shows the remaining, post-cut material thickness between the top and bottom depth of cuts around which the EMF may be bent and shaped.

Three-dimensional ESF shaped materials may be positioned so that center points of their geometric shapes are aligned, or they may be non-aligned to yield uniformly on non-uniformly shaped internal voids between the three-dimensional ESF materials, or they may be variations thereof. Voids may be filled with any range of materials such as insulation, concrete, sound abatement- or other material, or, they may be left devoid of filler.

FIG. 1 indicates depth of cut (a) on either side of an EMF sheet and the width of the cuts (b) that combine to provide proper loading strengths of a SIP or other panel when the manipulated fiberboard is hinged into an angled position. If depth (a) is greater than width (b) the pivot hinge may be limited by the material opposite the hinge-point and may interfere by coming in contact with the opposite material face. It is assumed that the total depth of cut from both sides (2×(a)) is less than the total thickness (t) of the panel. Otherwise the hinge angle may be limited.

To make a three-dimensional ESF design, a flat fiberboard material with a thickness (t) may first be cut (also referred to as a pre-determined folding indentation) on the top surface with a specific depth (a) and width (b). Next, a second cut with specified dimensions may be made, usually on the underside of the board. The pattern of cuts into the fiberboard may be given specific spacing dimensions (c) to yield a hinge-point designed, three-dimensional geometry.

In FIG. 1, the cuts may be made symmetrically about the middle of the board. After the cuts are made, the board may be bent about point (p) like a hinge with a material thickness (d) allowing a range of degrees (e) to yield a desired three-dimensional shape and design configurations.

Table 1 depicts exemplary input variables used to generate FIG. 1:

TABLE 1

Geometry considerations for FIG. 1.

| Variable | Symbol | Value | Unit | Notes |
|---|---|---|---|---|
| Thickness | t | 0.1250 | in | |
| Depth | a | 0.0400 | in | |
| Width | b | 0.0625 | in | |
| Spacing | c | 0.0500 | in | |
| Radius | d | 0.0450 | In | r = t − (2 × a)} |
| Rib Angle | e | 80 | deg | |

In table 1:
(t) corresponds to the flat panel thickness,
(a) corresponds to the depth of cut from both the top and bottom sides of the EMF board,
(b) corresponds to the width of cut, or the width of the blade or laser are used for cutting,
(c) corresponds to the spacing between the top and bottom cuts,
(d) corresponds to the remaining material through the thickness located between the top and bottom depth of cuts, and
(e) corresponds to the rib angle of desired three-dimensional ESF configuration.

Table 2 includes a variable range of preferred ESF joint dimension inputs specific to ¹⁄₁₀"-³⁄₁₆" EMF material use in building panel and furniture design. Range considerations for other material types or thicknesses may be possible using the computational software described in detail below.

TABLE 2

Range of ideal variables for ESF joints on EMF material.

| | | Range Values | | |
|---|---|---|---|---|
| Variable | Symbol | Low | High | Unit |
| Thickness | t | 0.1000 | 0.1875 | in |
| Depth | a | 0.0300 | 0.0700 | in |
| Width | b | 0.0450 | 0.1250 | in |
| Spacing | c | 0.0300 | 0.1000 | in |
| Radius | d | 0.0300 | 0.1000 | in |
| Rib Angle* | e | 0 | 90* | deg |

*Note regarding rib angle: The range of degrees for rib angles may be relative to positioning of top and bottom cuts to one another. There may be four possible positions for ESF joints, each having a range of 90 degrees (without causing unwanted tearing of the material's fibers). By changing the positioning of the top and bottom cuts, a full 360 degree range may be achievable.

Once the EMF material is hinged to create a three-dimensional ESF design, the shaped material may be held in place using several techniques, for example: positioning the material with a frame or brace; gluing or mechanical fastening; friction-fit connections between the cuts and manipulations; addition of a solid "filler" material such as glue, insulation, self expanding foam, or concrete between the three-dimensional shapes (in the voids); addition of inserts across the face of the three-dimensional shapes; addition of inserts that create supplemental support in all directions (e.g., laterally, on x-y axes, in multiple planes, etc); slots and connection tabs that lock materials into place; and so on.

Figure 1A:
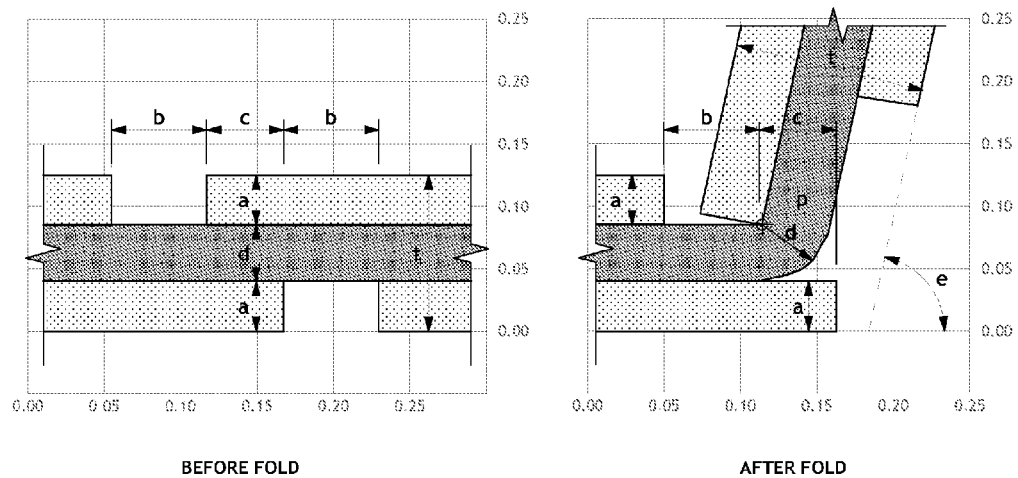
FIGS. 1A, 1B, 1C, and 1D are detail drawings showing several alternative methods for forming the cuts from a flat EMF fiber panel.

FIGS. 1A, 1B, 1C, and 1D show several alternative methods for forming the cuts into a flat EMF fiber panel. FIG. 1A demonstrates a method for producing a three-lamination flat EMF board that may be subsequently folded and shaped into a three-dimensional ESF material with unique characteristics. In this technique, a core layer of EMF may be designed and fabricated with higher tensile material fibers, higher elongation material, or synthetic fibers to improve and/or enhance the performance characteristics of the joint where the cuts (indentations) are made. Such higher tensile or higher elongation material may prevent fracturing that could occur in some situations where the joint is required to bend in extreme degrees.

Figure 1B:
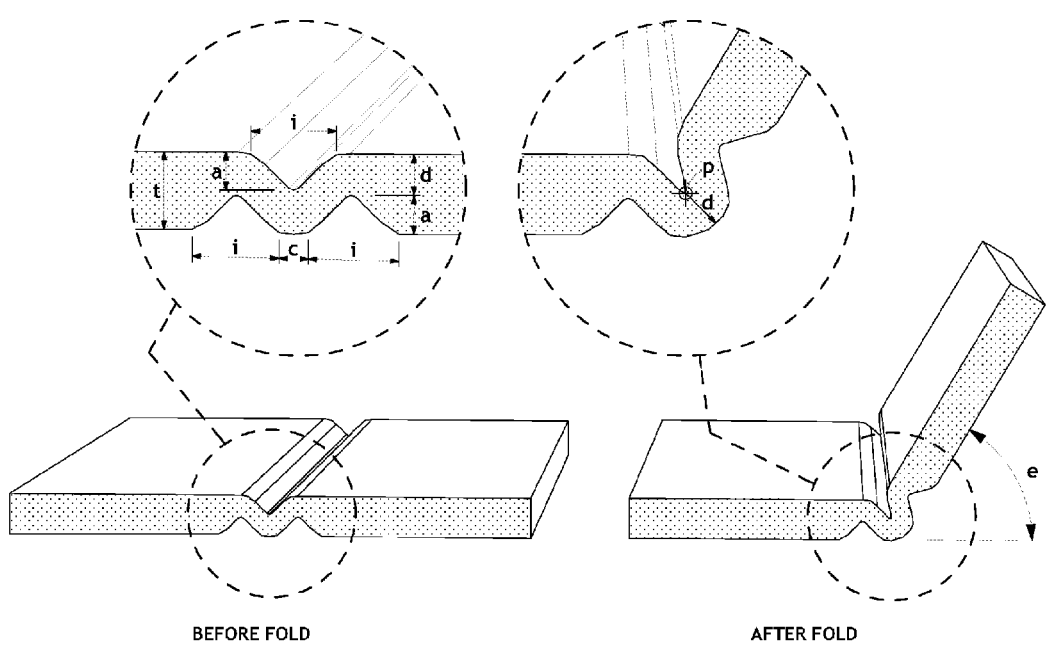

FIG. 1B shows that fibers may be selectively placed and formed into an EMF board and they may be densified into a contoured shape (i). The resulting shape may then be bent within a range of angles depending on desired material characteristics of final joint properties and desired three-dimensional geometry for the resulting formed, contoured shape or joint. Alternative molded joint configurations may also be possible for achieving such variations in joint angles and performance criteria when using this technique. FIG. 1B shows one possible configuration used to obtain a folded edge, details of which depend on performance criteria specified for the application. This technique may be ideally suited when repeated and mass-produced quantities of three-dimensional ESF panels are needed. Comparing this technique to the fiber molding EMF process to achieve three-dimensional material shapes, the extra time and cost incurred to fabricate dedicated top and bottom molds for the molded EMF process are saved.

Figure 1C:
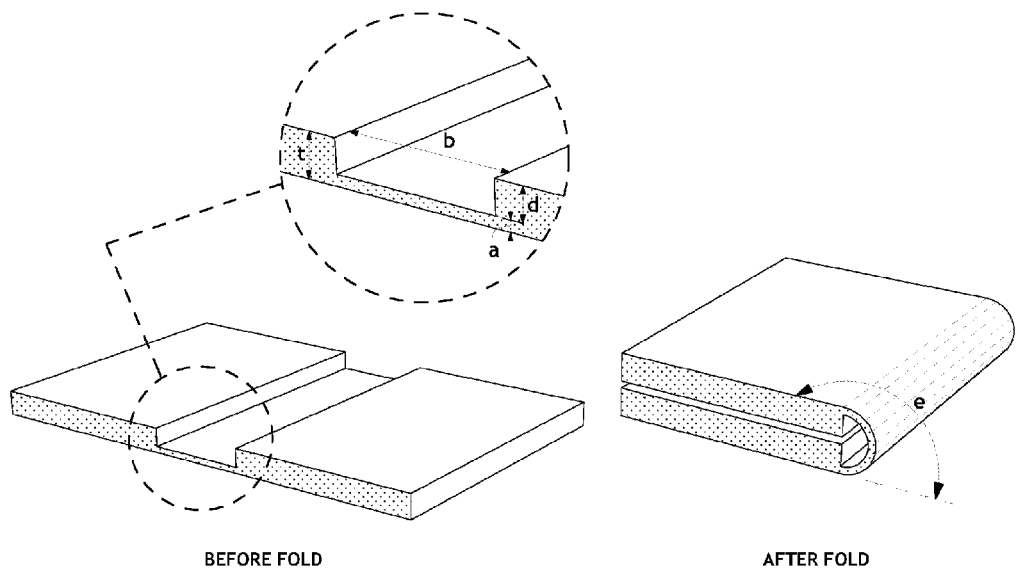

FIG. 1C illustrates yet another technique for varying dimensions (a) and (d) in the EMF material in order to yield a non-symmetrical three-dimensional ESF result. This technique may be accomplished by making wider cuts (b) into the EMF face and aligned (or non-aligned) cuts into one (or both) sides of the EMF board. This technique may provide varied, bending joint performance capabilities and the possibility to rotate the ESF a full 180 degrees.

Figure 1D:
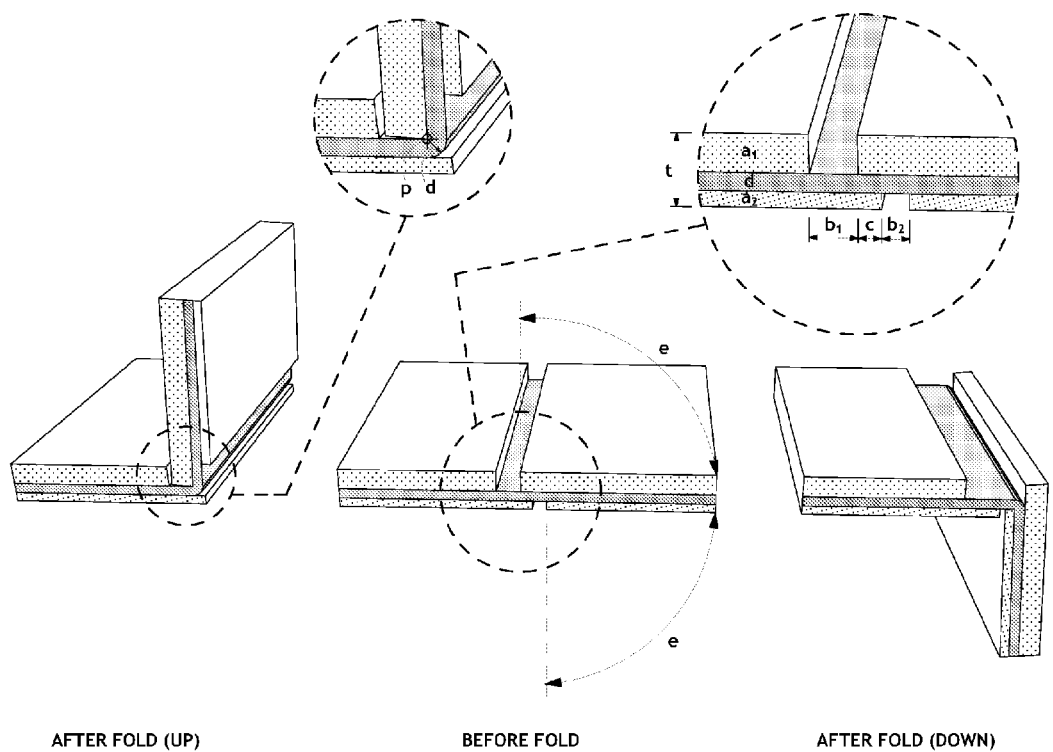

FIG. 1D shows yet another technique in which selective lamination of paper layers, fiberboard, carbon fiber, metals, or other material of varying thicknesses (a) or (d) may be integrated with, or in specific positions within, the EMF material during fabrication so that the resulting laminated EMF board may bend in varying degrees and shapes. The middle layer/lamination may be required to bend similarly to the thickness between the cuts, (d), shown in FIG. 1. The layers/laminates may be bonded together at the necessary distance (b) and (c) to simulate the indents in the panel. Each layer may be specified so as to contribute to the final requirements of the structure or product being designed. The layers and laminations may be non-symmetrical, similar, dissimilar, or exhibit other characteristics in order to yield unique properties in the resulting ESF material.

Figure 2:
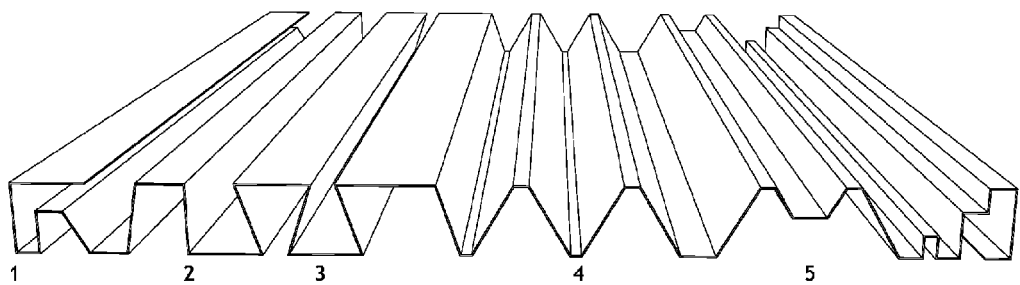
FIG. 2 is an isometric view showing several examples of three-dimensional ESF configurations.

FIG. 2 shows several examples of three-dimensional ESF configurations including: 1) edge geometry; 2) 90 degree ribs; 3) angles that are plus or minus 90 degrees from vertical; 4) repeated patterns; and 5) variable depth ribs. These geometries may occur uniformly across a three-dimensional ESF shape to yield a symmetrical surface or they may happen in a combination of geometries to yield a non-symmetrical ESF configuration.

While FIG. 2 shows three-dimensional folds occurring parallel to one another and resulting in uniform surfaces, the ESF method may also yield non-parallel and/or multi-planar three-dimensional surfaces, curves, compound curves, elliptical shapes, and other three-dimensional arrangements. A specific product example is a SIP in which a limitless range of rib angles of different three-dimensional configurations and volumes may therefore be attainable.

Figure 3:
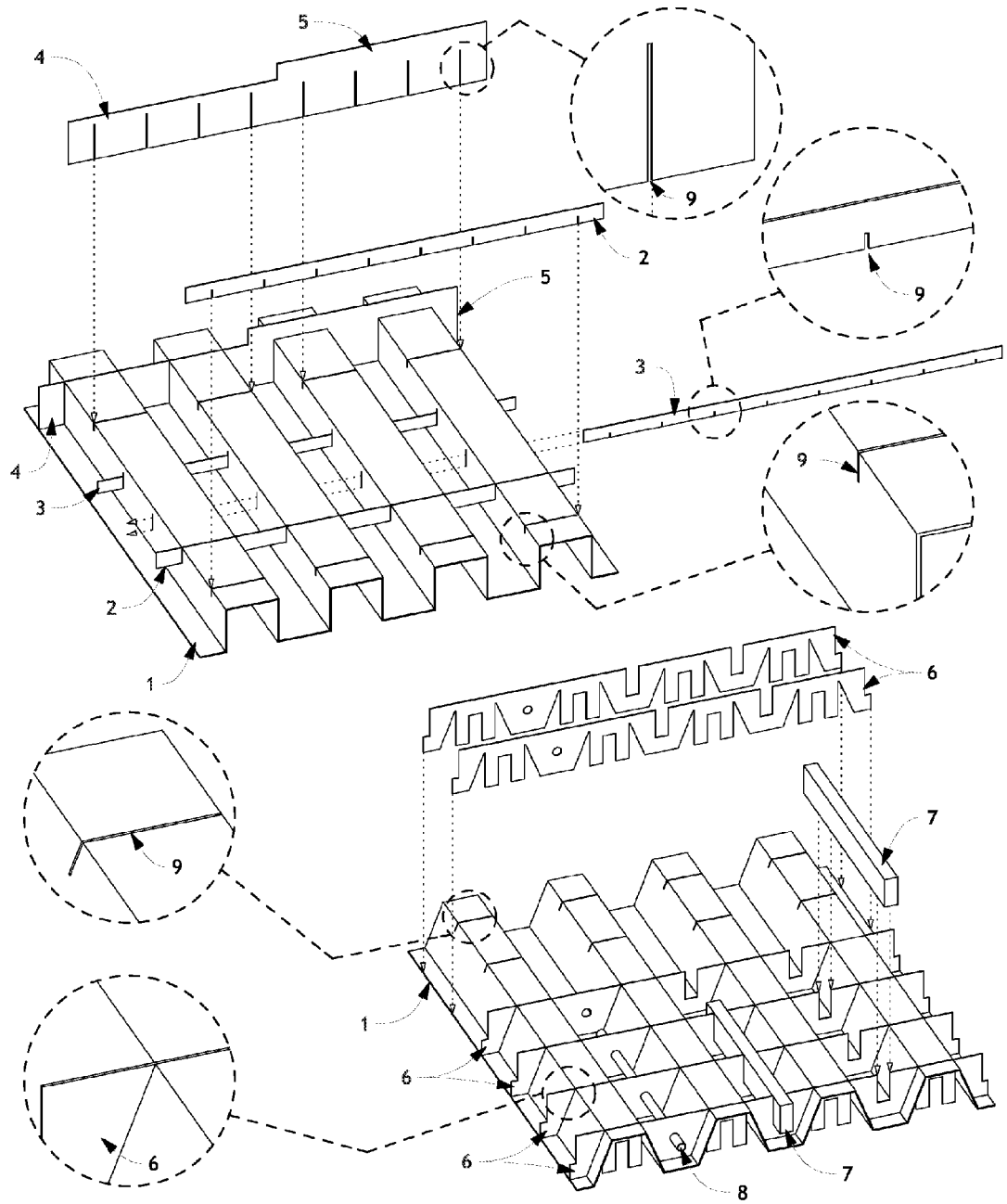
FIG. 3 is an exploded view showing an ESF with application of inserts to hold the three-dimensional configurations in place, as well as positioning of the inserts to provide accurate placement and securing of a variety of framing member types, stiffeners, non-framing tubing, and other types of components within an ESF shape.

FIG. 3 shows an ESF application with inserts to hold the three-dimensional configurations in place, as well as positioning of the inserts to provide accurate placement and securing of wood (or other) framing members, stiffeners, non-framing tubing, and other types of components within an ESF shape. In this example the inserts are positioned so as to be flush with the outside faces of the ESF geometry; however, the inserts may also be configured so as to extend outside the three-dimensional ESF shape (e.g., such as in FIGS. 10 and 11).

As illustrated, the example inserts are designed as "planks" holding three-dimensional ESF configurations in place. Inserts may provide accuracy in placement of, and securing of, wood (or other) members and/or stiffeners within, and/or flush with an ESF configuration. Inserts may also be placed so as to position blocking, stiffeners, or other components outside the boundaries of the ESF configuration's surface. FIG. 3 illustrates examples of the following configurations: 1) ESF configuration; 2) low-profile insert shown as being placed from top position of three-dimensional shape; 3) low-profile insert being placed from side of three-dimensional shape and into cuts; 4) side of full-depth insert with edges and top plane aligned with those of ESF configuration; 5) side of full-depth insert with top plane extending outside the edges of the ESF configuration; 6) full-depth insert fabricated with holes for accommodation of conduit, framing, or other building components; 7) wood framing member installed in ESF configuration (6); 8) conduit installed in ESF configuration (6); and 9) slot for snapping and locking insert components into ESF configuration.

To position the inserts, small slots may be made on the top side of the three-dimensional ESF material so that the inserts may be slid downward and into position. The slots may be slightly undersized to create a friction connection so that glue or mechanical fastening may not be needed to further secure the insert within the slot.

FIG. 3 also shows that a set of inserts may be positioned in the same manner but from the opposing side of the three-dimensional ESF material. However, a second set of inserts may not be required. In all ESF shapes, inserts may be placed perpendicular, parallel, or at angles to the three-dimensional ESF material; inserts may run laterally through the ESF configurations; or inserts may occur in combinations thereof.

Figure 4:
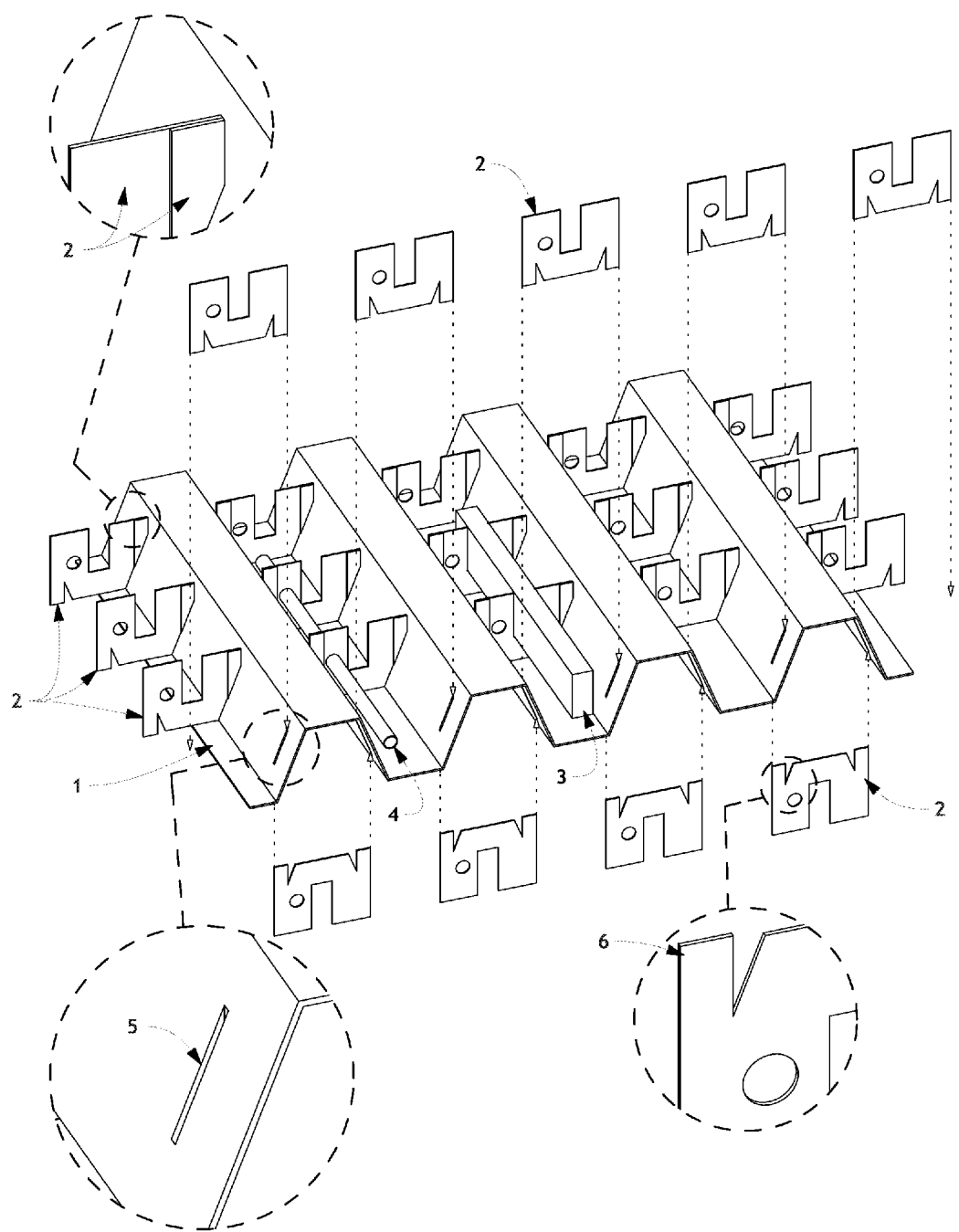
FIG. 4 is an exploded view showing an alternative method for configuring and placing inserts in a three-dimensional ESF shape.

FIG. 4 shows an alternative method for configuring and placing inserts in a three-dimensional ESF shape. In this method, the inserts may be created as individual components instead of continuous "planks." This illustration shows slots positioned at mid-point in the ESF shape so that inserts may be placed within the boundaries of the shape. The inserts may likewise be created as described in FIG. 3 so that they may be positioned flush with, or outside of the three-dimensional ESF configuration. As the slots are made in the EMF material and are positioned at mid-point through the ESF shape, the inserts may be positioned flush with the ESF face while holding the material in a desired ESF configuration. Slots, however, may also be placed so as to hold inserts, blocking, or other components outside the configuration. FIG. 4 illustrates: 1) ESF configuration; 2) full-depth, individual component inserts positioned with top plane aligned at top surface of ESF configuration (insert has holes for accommodating conduit, framing, or other building components, and it has slots for placement of wood framing member); 3) wood framing member installed in ESF configuration; 4) conduit installed in ESF configuration; 5) slots for snapping and locking insert components into ESF configuration; and 6) connection tabs.

FIG. 4 also shows that inserts may have an angled cut resulting in an "M" shape as shown. The M-cut may allow the insert to conform to the angle of the three-dimensional ESF configuration. Multiple designs of individual inserts may be used to provide variable geometrical shapes for use in this method. FIG. 4 also shows a hole placed in the insert to accommodate and support conduit runs within a three-dimensional ESF geometry. This technique is demonstrated in SIP design for integration of conduit and other building components within three-dimensional ESF cores. All insert methods (as shown in the following figures) may also allow for installation of components such as 2×4 lumber (or other framing materials), conduit, HVAC, or additional building elements.

Figure 5:
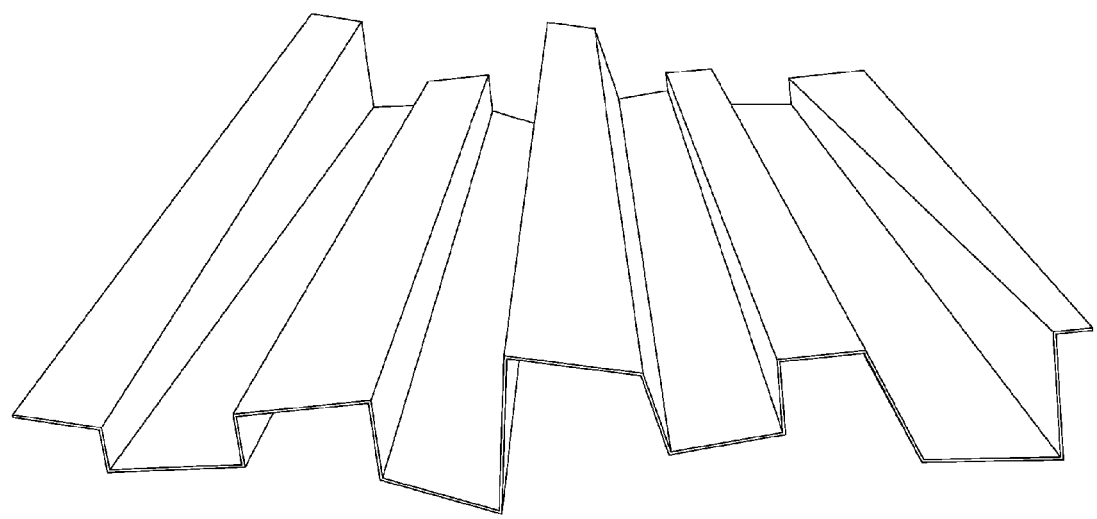
FIGS. 5 and 6 are isometric views showing non-parallel ESF lines used to achieve multi-planar, curved, and elliptically shaped surfaces and configurations.
Figure 6:
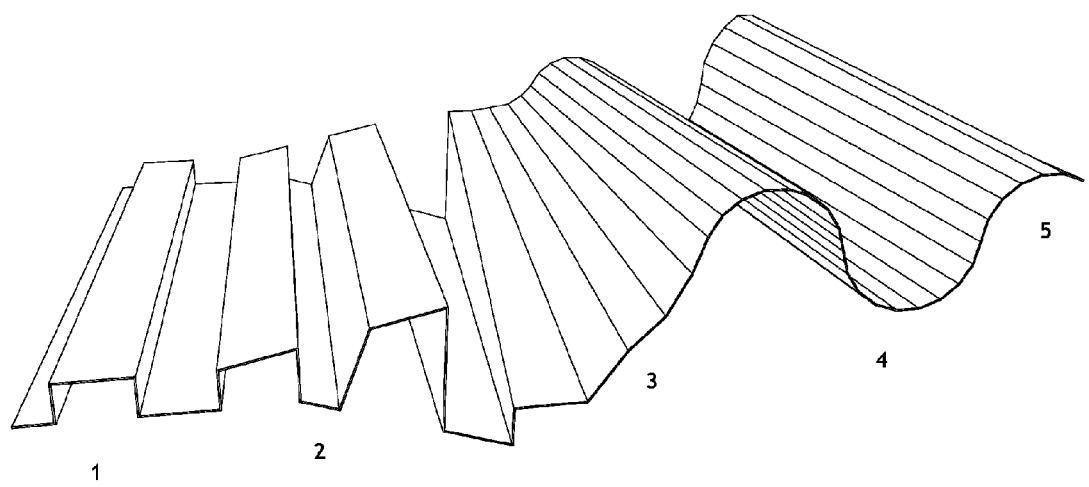

FIGS. 5 and 6 show non-parallel ESF lines yielding multi-planar, curved, and elliptically shaped surfaces. FIG. 5 illustrates an example of a non-uniform, multi-planar three-dimensional ESF material in a range of possible non-parallel ESF configurations. FIG. 6 illustrates an example of an ESF configuration translating from parallel to non-uniform, multi-planar surfaces, and then to compound curving forms; these are but a few examples of shapes attainable with the technology. FIG. 6 also illustrates: 1) orthogonal, parallel surfaces (as reference point for subsequent shapes); 2) multi-planar, non-orthogonal surfaces; 3) compound, non-orthogonal surfaces; 4) simple curved surface; and 5) compound curved surface.

Figure 7:
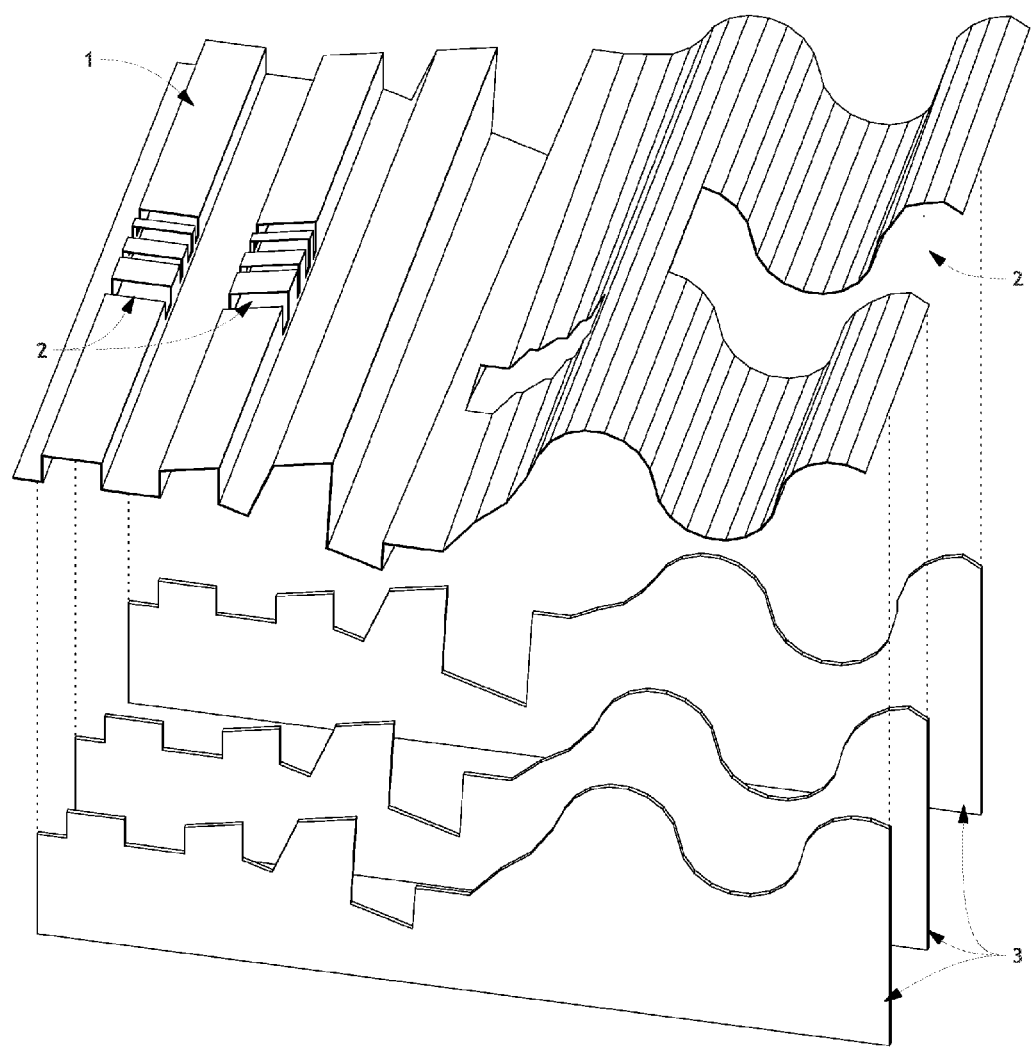
FIG. 7 is an exploded isometric viewing showing non-parallel surfaces with cut-outs and inserts integrated into the ESF configuration.

FIG. 7 shows non-parallel surfaces with cut-outs and inserts integrated into the ESF configuration. FIG. 7 illustrates an example of a non-uniform, multi-planar ESF configuration with cut-outs and inserts integrated into the configuration and includes: 1) ESF configuration; 2) areas where material has been cut-out or sliced away; and 3) insert for supporting a desired profile.

Figure 8:
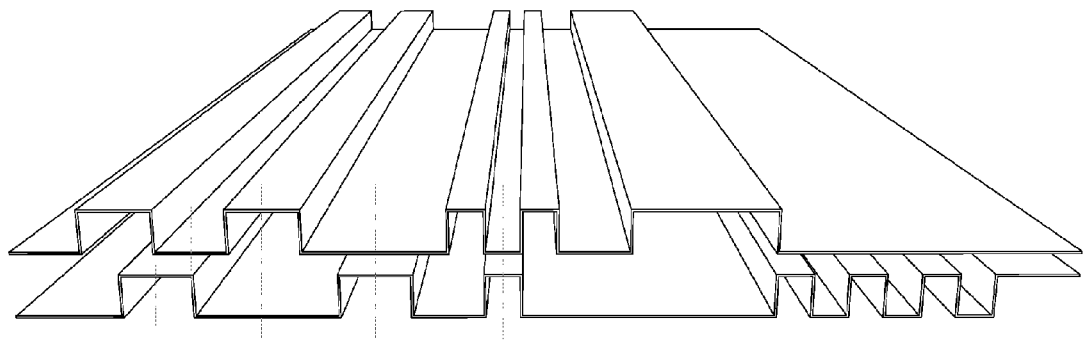
FIGS. 8 and 9 are isometric views illustrating examples of the ESF technique being used to create a three-dimensional configuration with exposed, corrugated three-dimensional exterior surfaces.
Figure 9:
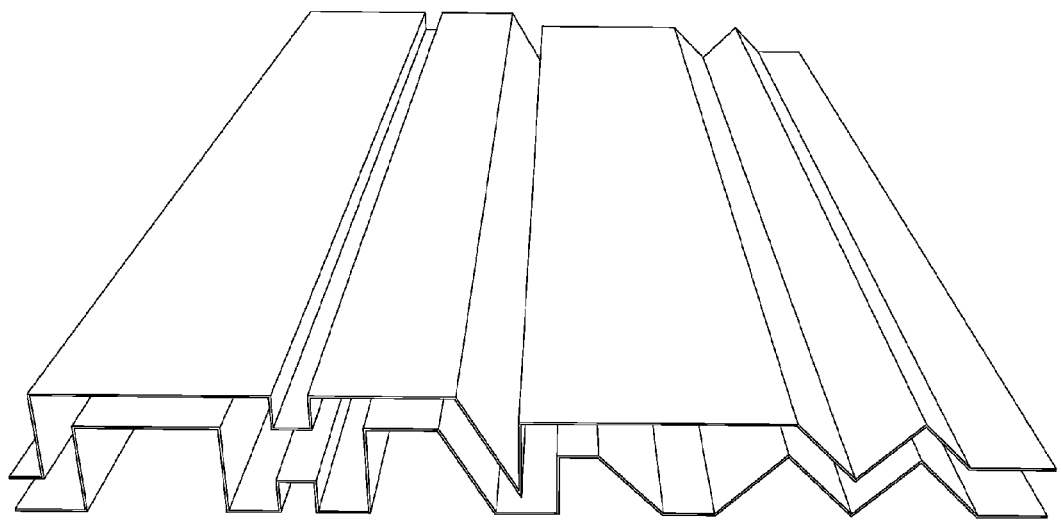

FIGS. 8 and 9 show examples of the ESF technique being used to create a configuration with exposed, corrugated three-dimensional exterior surfaces. The three-dimensional corrugations may be held together at equal or varying distances along the x and y axes to yield panels of varying thickness. The void created between the three-dimensional ESF materials may be filled with insulation, concrete, or other, or it may be left unfilled, or it may be partially filled, or a combination thereof. By filling the area between the three-dimensional ESF cavities, a range of thermal, structural, sound-attenuating, or other characteristics may be achieved. A smooth, finishing material may or may not be added to the outer surfaces of the ESF panels.

FIG. 8 illustrates an example of an ESF configuration arranged in laminations of two sections and with configuration center points aligned in order to create a three-dimensional internal void. FIG. 9 illustrates an example of three-dimensional ESF materials arranged in laminations of two different sections with center points offsetting in order to create a three-dimensional material with a non-uniform internal void. With respect to FIGS. 8 and 9, it should be understood that ESF materials may be arranged in laminations of two or more boards and may be positioned so that center points of the shaped geometries are aligned, or the centerlines may be non-aligned. Centerline positioning yields uniformly or non-uniformly shaped internal voids between the three-dimensional ESF materials. These voids may be filled with a range of materials such as insulation, concrete, or other, or, they may be left devoid of filler.

Figure 10:
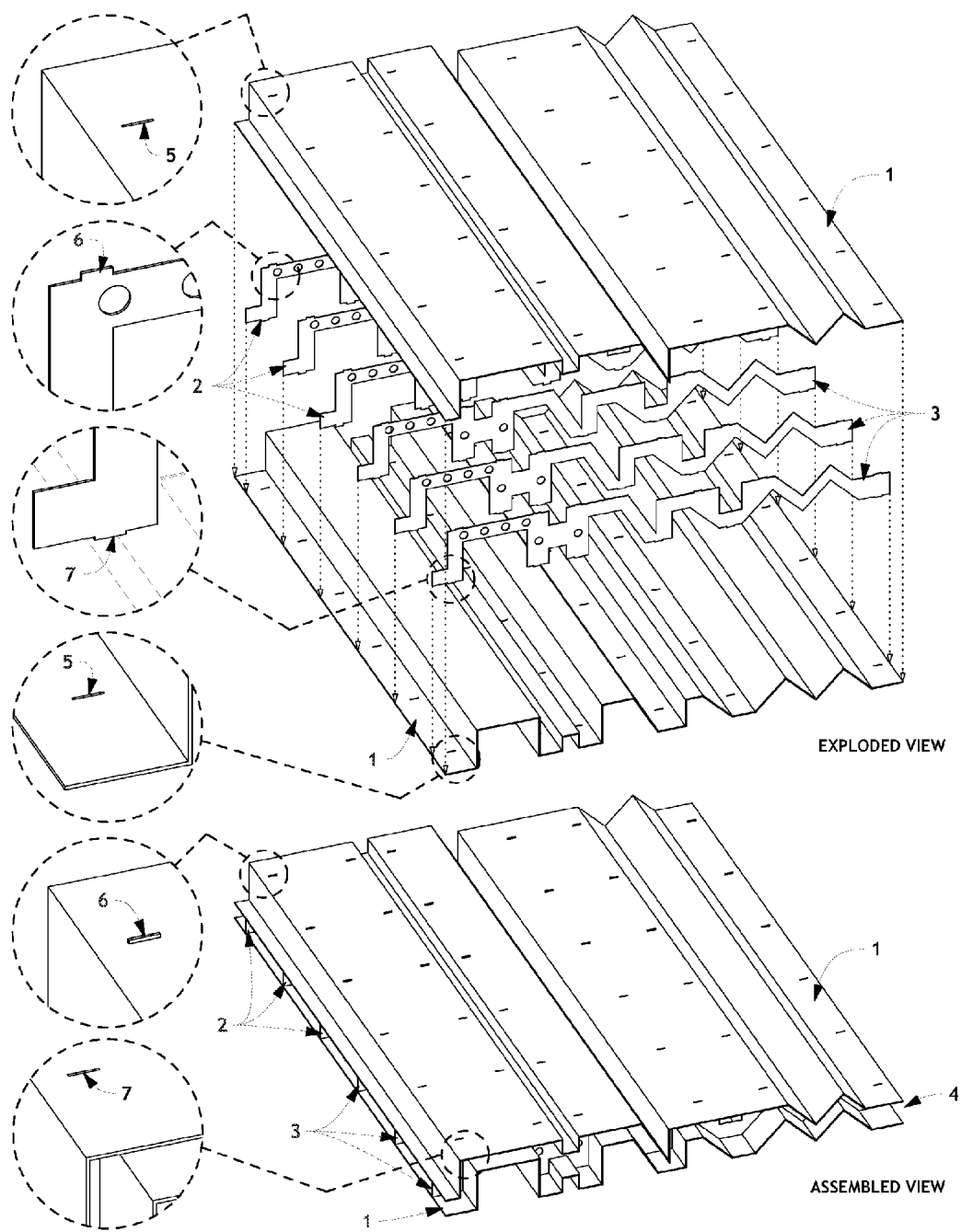
FIG. 10 shows two separate views (exploded and assembled) of a sample ESF assembly having non-uniform, non-aligned, and off-set void configurations.

FIG. 10 shows two separate views (exploded and assembled) of a sample ESF assembly having non-uniform void configurations. The views show inserts integrated between the top and bottom three-dimensional ESF surfaces. These inserts may perform as spacers supporting the opposing ESF surfaces while providing structural support to the assembly and giving desired dimension and shape to the voids. Tabs located on the inserts fit together with the slots in the upper and lower ESF surfaces to lock the assembly together. FIG. 10 illustrates the following: 1) ESF configurations; 2) spacer inserts with connection tabs that extend beyond ESF configuration edges (refer to 6); 3) spacer inserts with connection tabs that are flush with ESF configuration edges (refer to 7); 4) voids created between top and bottom ESF configurations; 5) slots for snapping and locking components together with connection tabs; 6) connection tabs with a depth greater than ESF configuration thickness (so tab may extend beyond ESF configuration face after assembly); and 7) connection tabs with same depth as ESF configuration (so tab will be flush with ESF configuration face).

Figure 11:
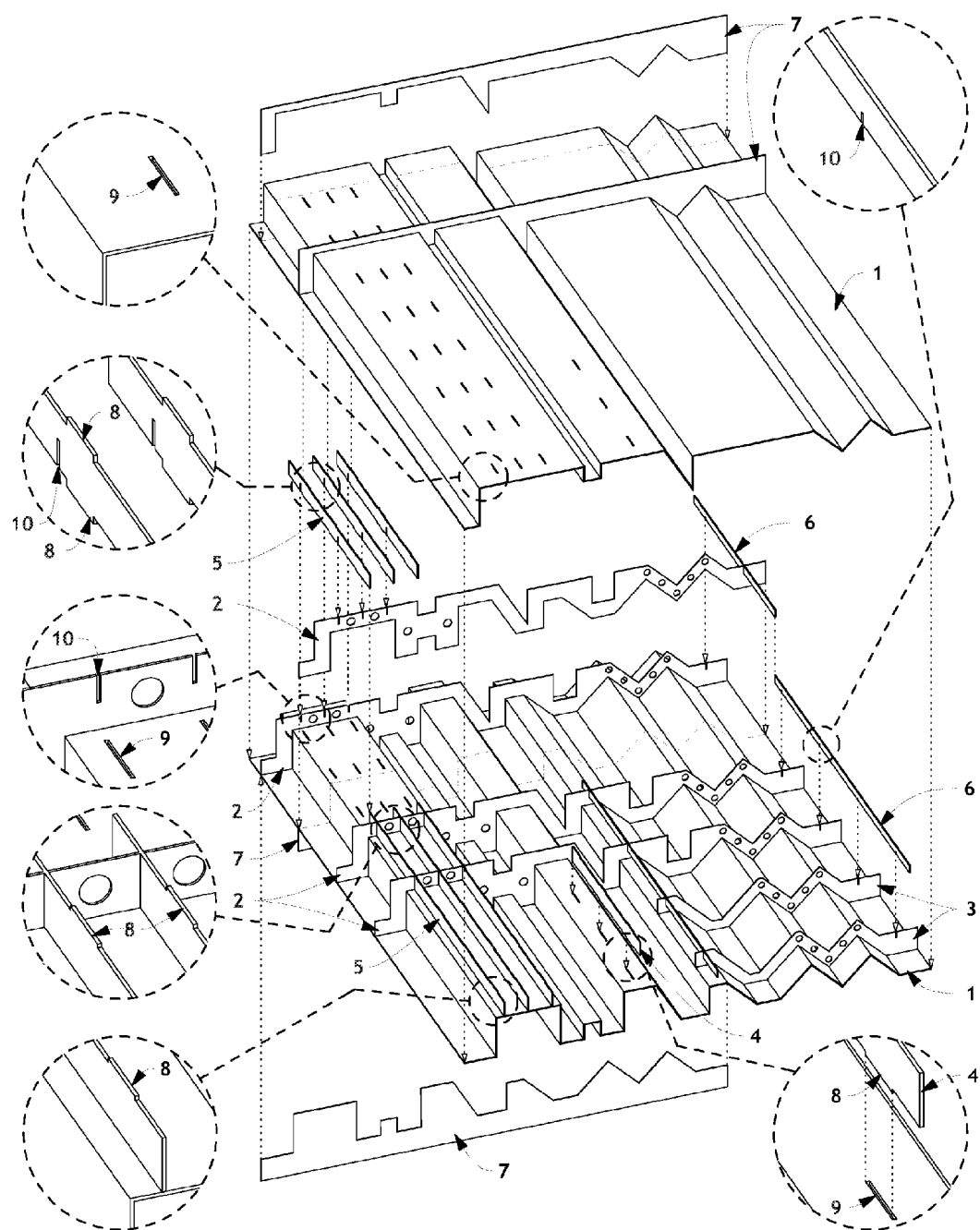
FIG. 11 is an exploded view illustrating possibilities for three-dimensional ESF configurations that have a range of insert shapes providing a variety of potential void shapes.

FIG. 11 shows possible three-dimensional ESF configurations with a range of insert shapes providing a variety of potential void shapes. This example indicates possibilities for insert spacers to be joined with external or internal faces of the three-dimensional ESF shapes in order to create voids which are parallel and/or perpendicular to the ESF material. Such insert placements may yield any variety of the following: open voids between ESF surfaces; partially open voids; variations of open and partially open voids; placement location for holding building conduit, components, insulation or other materials in a range of complex positioning possibilities; and so on. FIG. 11 illustrates the following: 1) ESF configuration; 2) spacer inserts perpendicular to the ESF configuration and with holes for accommodation of conduit, framing, or other building components; 3) spacer inserts running perpendicular with void (but only partially across configuration); 4) inserts running parallel with internal voids made with connection tabs (8) for slots (9); 5) inserts running parallel with internal voids and integrated with perpendicular inserts (shown pulled away and in locked position) made with connection tabs (8) for slots (9); 6) inserts running parallel with internal voids and integrated with perpendicular inserts (shown pulled away from ESF 3D material); 7) inserts located on opposing sides of ESF configuration; 8) connection tabs; 9) slots for snapping and locking components together with connection tabs; and 10) slots for creating slot-to-slot insert connection.

As shown in FIGS. 12 and 13, EMF boards may be manipulated during the fiber forming processes to yield custom hinging possibilities for three-dimensional ESF configurations. For example, hinging materials may be embedded or integrated in the EMF in order to strengthen ESF cuts and shapes; to contribute to hinging capabilities of multi-directional three-dimensional ESF shapes where different characteristics are desired at the directional changes in the ESF material; or otherwise. The hinging materials may be applied in a number of ways such as embedment in EMF boards during EMF fabrication, or through post-fabrication attachment to EMF, three-dimensional ESF shapes, or ESF configurations.

Such hinging materials may include carbon fiber threads or plates, metals, plastics, webbed, hinged, open-weave, or other substances that interlock, integrate, or otherwise bond with the EMF wet-fiber mat prior to the fiberboard pressing and drying phase. The hinging materials may be placed so as to be flush with the finished EMF material, which may result in an exposed or partially exposed ESF hinge. Alternatively, the hinge material may be placed so as to be completely embedded within the EMF board thickness. However, it is understood that hinging materials are not necessary for achieving structural soundness in all three-dimensional ESF configurations but rather may be used to augment or vary the desired characteristics of final ESF products.

FIGS. 12 and 13 show examples of a hinge material embedded in the EMF material so as to yield specific bending properties for a 3D ESF shape. Hinge material may be integrated into material and used with or without cutting or notching the EMF material. FIGS. 12 and 13 illustrate the following: 1) EMF material; 2) ESF joint; 3) embedded hinge; 4) joint created along bending axis; (t) material thickness; (h) hinge location measured from bottom face of EMF material; and (e) angle of desired 3D ESF shape.

Figure 14:
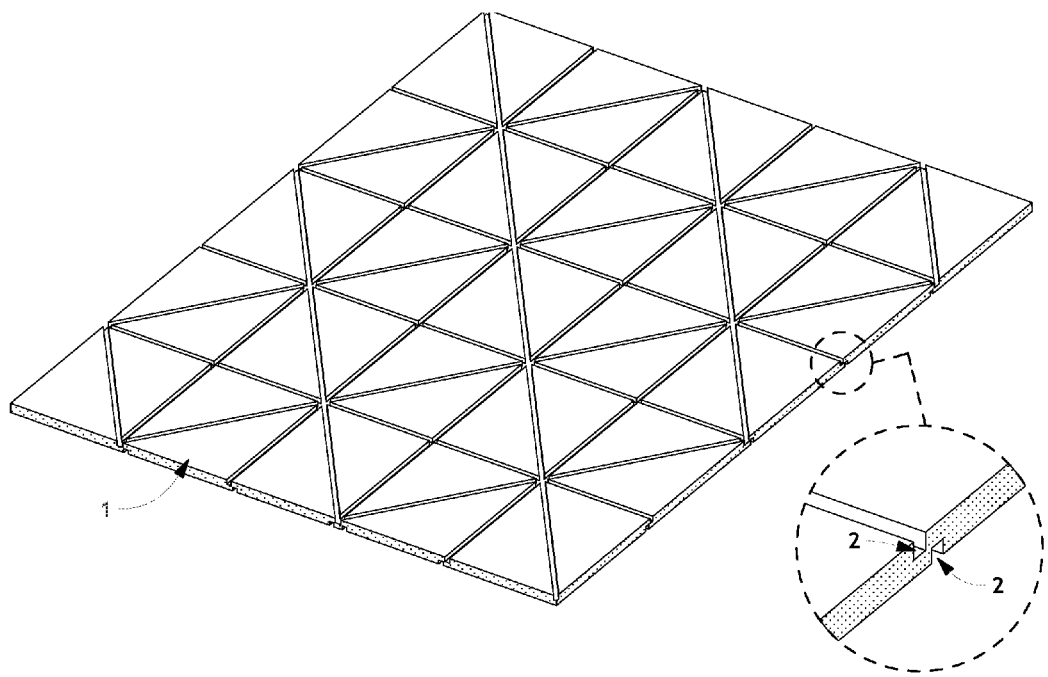
FIG. 14 is an isometric view illustrating an example of a flat EMF material with three-dimensional ESF cuts laid out to result in an ESF configuration capable of achieving multiple directions.
Figure 15:
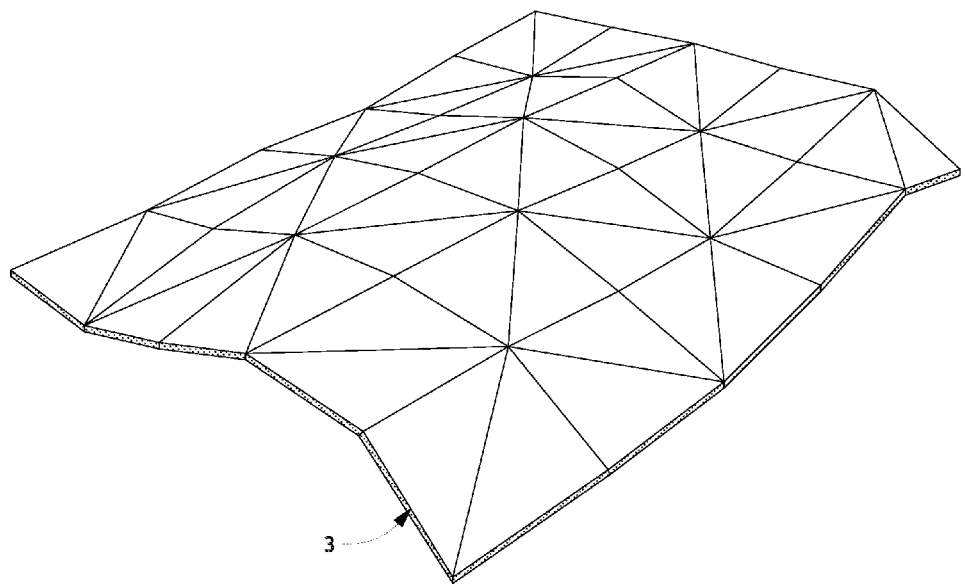
FIG. 15 is an isometric view showing the cut and folded EMF of FIG. 14 manipulated to yield a sample, multi-directional three-dimensional ESF shape.

FIG. 14 illustrates an example of a flat EMF material with three-dimensional ESF cuts laid out to result in an ESF configuration capable of achieving multiple directions. As shown in FIG. 14, ESF joints may be laid out and cut into a flat EMF substrate (in any variety of patterns) in order to yield a three-dimensional ESF configuration with multi-directional surfaces as shown in FIG. 15. FIG. 15 shows the cut and manipulated EMF of FIG. 14 bent at specific cuts to yield a sample, multi-directional, three-dimensional ESF shape. Insert spacers may or may not be used to hold the ESF material into its three-dimensional shape. FIGS. 14 and 15 illustrate the following: 1) EMF material showing example pattern cut into surface; 2) ESF joint; and 3) ESF material bent at the cut pattern to yield an example three-dimensional ESF configuration.

Figure 16:
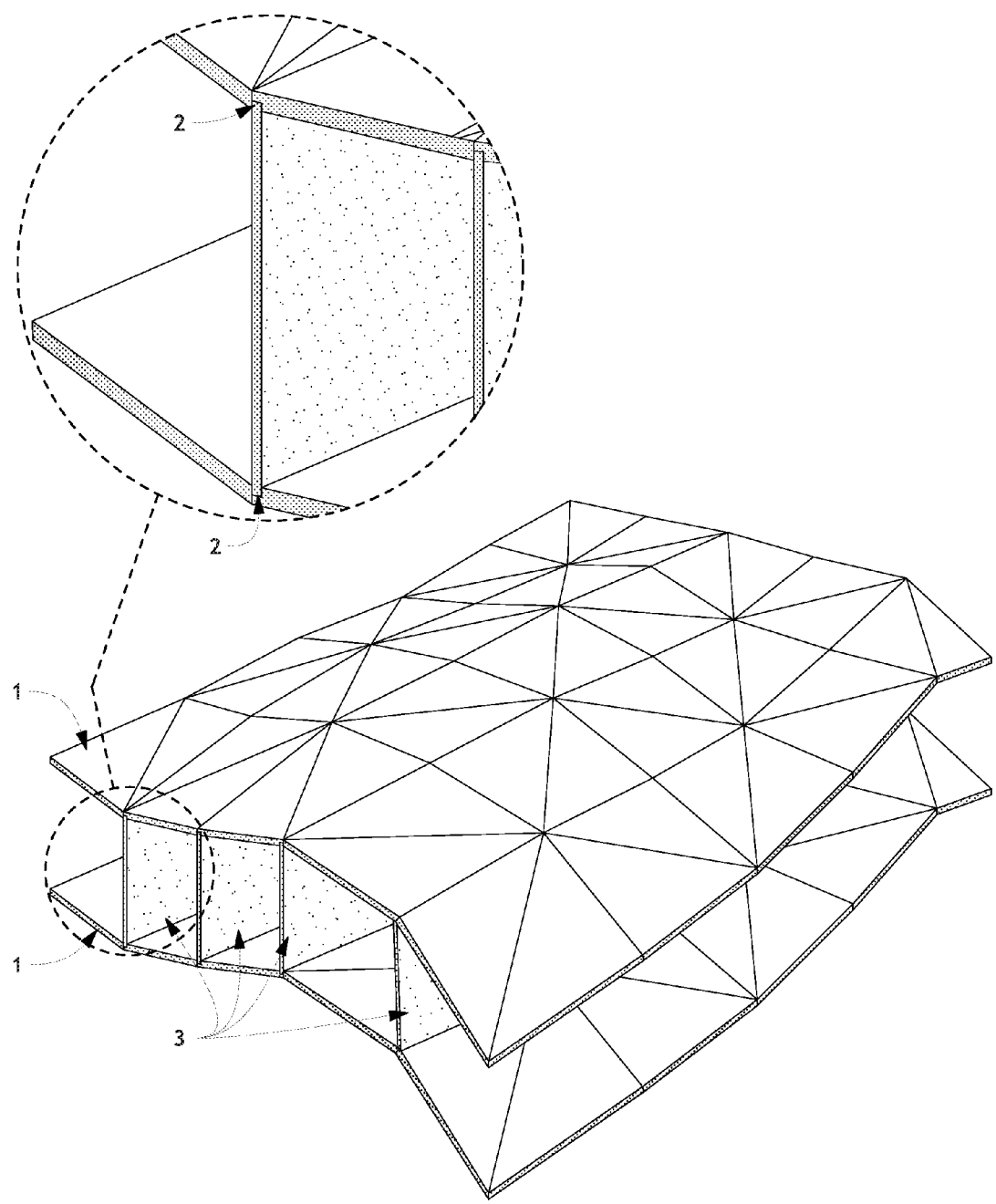
FIG. 16 is an isometric view of the example of the multi-directional three-dimensional ESF shape in FIG. 15 shown with inserts integrated so as to create a void between two layers of ESF material.

FIG. 16 is an example of the multi-directional three-dimensional ESF shape in FIG. 15 with the addition of inserts integrated so as to create a void between two layers of ESF material. FIG. 16 illustrates the following: 1) three-dimensional ESF material; 2) three-dimensional ESF joint (with insert set inside joint); and 3) inserts used to maintain complex geometry.

Control Software

In some implementations, computer software may be utilized in computer-based computational processes and CNC fabrication to perform the ESF method to yield three-dimensional ESF configurations. The disclosed software may allow users to design high-performance EMF materials including flat fiberboard substrates that may be cut, folded, bent and otherwise shaped into three-dimensional structural configurations. The disclosed software may allow the user to determine optimal fiberboard and three-dimensional substrate designs while balancing structural performance and production and manufacturing efficiencies through user input options.

Figure 17:
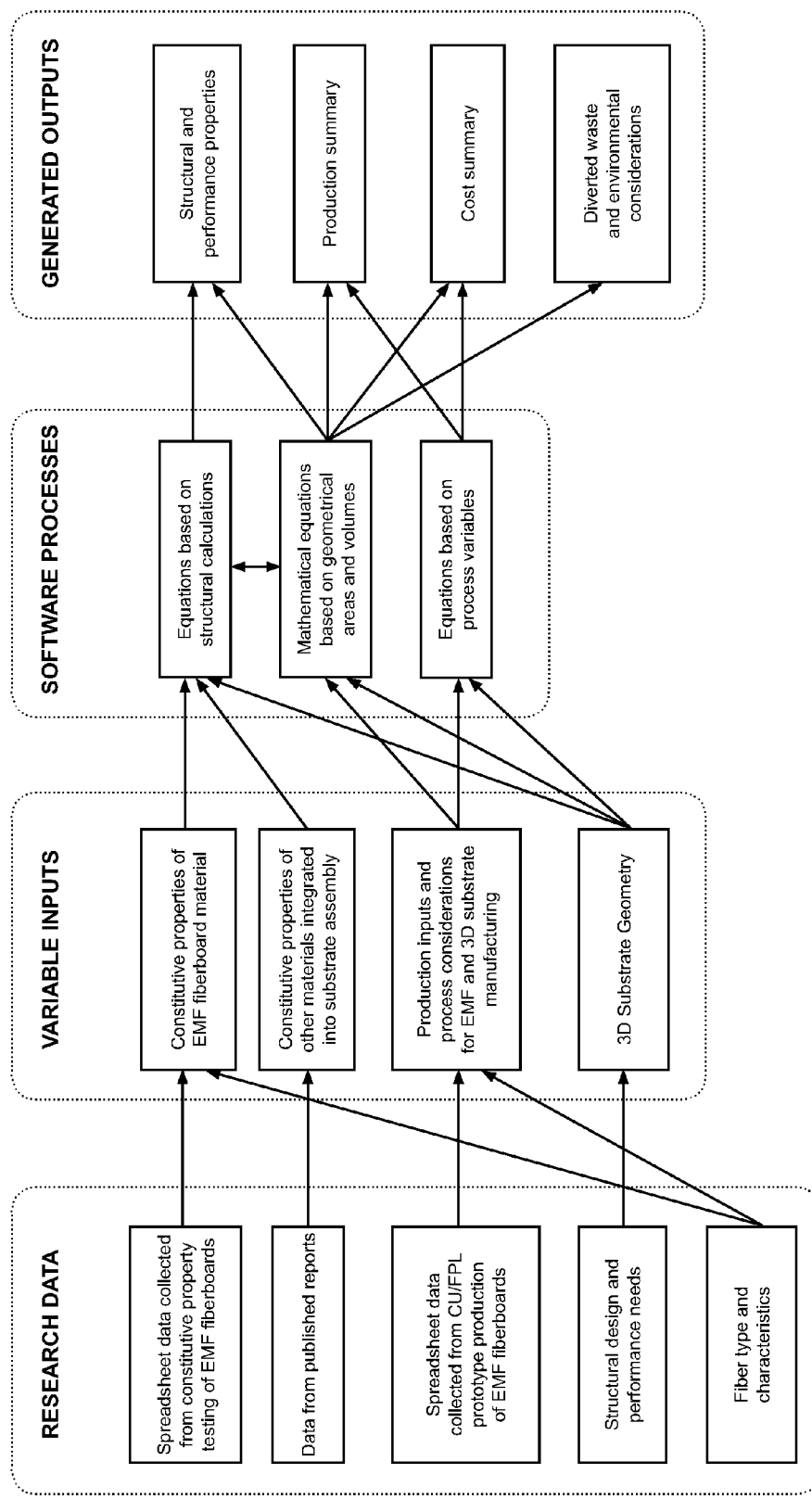
FIG. 17 is a block diagram illustrating the relationship of research-based data inputs; user-defined variables; software processes; and software-generated outputs for EMF fiberboard, three-dimensional substrate, and three-dimensional SIP designs in the disclosed software.

FIG. 17 is a block diagram illustrating the relationship of research based data inputs, user-defined variables, software processes, and software-generated outputs for fiberboard, three-dimensional substrate, and three-dimensional SIP designs in the disclosed software. As respectively illustrated in FIG. 17, elements of the research data affect the variable inputs, elements of the variable inputs may be inputs for the software processes, and the software processes generate the control outputs. The generated outputs may then be utilized as the inputs for EMF fiberboard production and CNC fabrication.

The research data may include spreadsheet data collected from constitutive property testing of EMF fiberboards, data from published reports, spreadsheet data collected from prototype production of EMF fiberboards, structural design and performance needs, fiber type and characteristics, and so on. The variable inputs may include constitutive properties of EMF fiberboard material, constitutive properties of other materials integrated into substrate assembly, production inputs and process considerations for EMF and three-dimensional substrate manufacturing, fiberboard three-dimensional substrate geometry, and so on. The software processes may include equations based on structural calculations, mathematical equations based on geometrical areas and volumes, equations based on process variables, and so on. The generated outputs may include structural and performance properties, production summary, cost summary, diverted waste, environmental considerations, and so on.

The variable inputs will now be elaborated. The constitutive properties of EMF fiberboard material may include the following: fiber type or fiber mixture; density; material modulus (MOE); tension/compression strength parallel to the fiberboard material's surface; internal bond strength perpendicular to the fiberboard material's surface; effects of additives to EMF mixes for achieving performance enhancements such as fire retardance, water resistance, strength characteristics (e.g. resins, minerals, etc); and so on. The constitutive properties of other materials integrated into cut-shape substrate assembly may include the following: foam insulation, 2× wood framing (for sill and top plates), fasteners, cam-lock connectors, and so on. The fiberboard and three-dimensional substrate geometry may include the following: flat fiberboard (including material thickness, overall length, overall height, and so on), three-dimensional substrate design (including overall geometrical design needs, cut-shape geometry [including overall configuration, overall depth from face-to-opposing-face of geometry, and so on], sequencing of rib pattern, center-to-center cut-shape geometry for overall rib pattern width, rib angle design, material thickness, overall length of cut and shaped fiberboard, overall height of cut and shaped fiberboard), and so on. The production inputs and process considerations for EMF and three-dimensional substrate manufacturing may include the following: capital costs, annual fixed costs, variable costs for EMF inputs (e.g., cost of raw fiber feedstocks, energy and water costs), variable costs for three-dimensional SIP inputs (e.g., cost of foam insulation, cam-locks, etc), annual product production requirements (e.g., for full production and/or batch production runs), equipment considerations based on known data from prototype production runs (e.g., press type and openings, press operating pressure, forming and drying time, etc), and so on.

The outputs of the software processes will now be elaborated. The disclosed software may generate a variety of geometric outputs. Equations (see Appendix I for examples) may be used to generate three-dimensional geometrical considerations based on input needs (e.g., three-dimensional SIP panel thickness, rib spacing, furniture designs, etc.). Equations (see Appendix I for examples) may be used to determine effects and location of cuts to the EMF fiberboard to produce a three-dimensional shape. Equations (see Appendix I for examples) may be used to produce geometrical visualization for the geometrical inputs for both the desired three-dimensional shape and necessary cuts into the EMF fiberboard. Equations (see Appendix I for examples) may be used to estimate hollow volume between ribs and faces to calculate total foam needs. Three-dimensional SIP or other final product weight and specific gravity may be compared with other SIPs or products. Equations (see Appendix I for examples) based on geometrical areas and volumes may be used to determine three-dimensional shape processing needs. Spreadsheet data collected during prototype production of EMF fiberboards may be used to generate trend equations for refining performance estimates. Spreadsheet data collected from constitutive property testing of EMF fiberboards may be used to generate trend equations for refining performance estimates. Data from published research (e.g., test reports from SIP or furniture manufacturers, data about recycled waste, etc) may be used for comparison with estimated three-dimensional SIP performance.

The generated outputs will now be elaborated. The structural and performance properties may be structural and performance properties of flat EMF fiberboards, 3D fiberboard substrates, three-dimensional SIPs, furniture, packaging, or other panel structures compared with estimates based on fiber characteristics data and desired fiberboard substrate design characteristics including the following: combined estimated three-dimensional SIP deflection and maximum stress or modulus of rupture (see Appendix I for examples); estimated structural values based on structural calculations (e.g., quarter-point loading equation, edge crush, flat crush, insulation R-value, etc.) (see Appendix I for examples) that may be used to estimate performance characteristics; transverse load, including estimated ultimate load & deflection (see Appendix I for examples); transverse allowable load data for key deflection points (see Appendix I for examples); flat direction load, including crush load, deflection, and buckling considerations; axial load, ultimate load (see Appendix I for examples); axial load @ height/800, allowable load based on IBC and IRC code required safety factors; three-dimensional SIP product strength comparisons to other marketed SIP strengths (see Appendix I for examples); three-dimensional SIP strength considerations based on three-dimensional SIP's foam insulation placement within panel core (see Appendix I for examples); properties of cut-shape joints (e.g., depth, width, spacing) to achieve substrate design for structural and performance requirements (see Appendix I for examples); estimated strength of cut-shape joint; estimated strength of cut-shape joints with embedded hinging material (see Appendix I for examples); thermal performance of EMF fiberboard substrate (see Appendix I for examples); thermal performance of foamed three-dimensional SIPs, or other three-dimensional fiberboard cut-shapes (e.g., estimated R value) (see Appendix I for examples); usable conduit and framing void areas within three-dimensional SIPs, or other three-dimensional fiberboard substrates (see Appendix I for examples); nailable surface area per panel face (see Appendix I for examples); and so on.

The production summary (which may be generated for flat EMF boards, three-dimensional fiberboard substrates, and three-dimensional SIPs [based on user-defined substrate design and production variables]) may include the following: production rates for forming, pressing, and drying of flat EMF fiberboard (see Appendix I for examples); location and size of cut-shape joint locations required to yield desired three-dimensional substrate design from a flat EMF fiberboard (see Appendix I for examples); production volume capabilities for flat EMF fiberboards, three-dimensional fiberboard substrates, and three-dimensional SIP products over time based on full-production runs and batch-run scenarios (see Appendix I for examples); and so on.

The cost summary (which may be based on user-defined substrate design and production variables) may include the following (see Appendix I for examples): per-unit flat EMF fiberboards, three-dimensional fiberboard substrates, and three-dimensional SIP cost summary detailed as capital-, annual-fixed-, and variable costs; estimated cost of goods sold (COGS) including fiberboard units for both flat fiberboard and three-dimensional substrates; estimated shipping costs of flat EMF fiberboards, three-dimensional fiberboard substrates (three-dimensional substrate), and three-dimensional SIPs; per unit three-dimensional SIP panel cost for factory fabrication and foaming; and so on.

The diverted waste and environmental considerations (which may be estimated based on substrate design and production process variables) may include the following: amount of post-consumer fiber waste diverted to make three-dimensional SIP fiberboard substrate and full panels; reduction of trees cut down, barrels of oil saved, and savings in volume of landfill space (due to recycled input sources in fabricating EMF products vs. virgin material sources used in manufacturing and production of standard products especially SIPs); energy consumption for EMF production and manufacturing; and so on.

Figure 18:
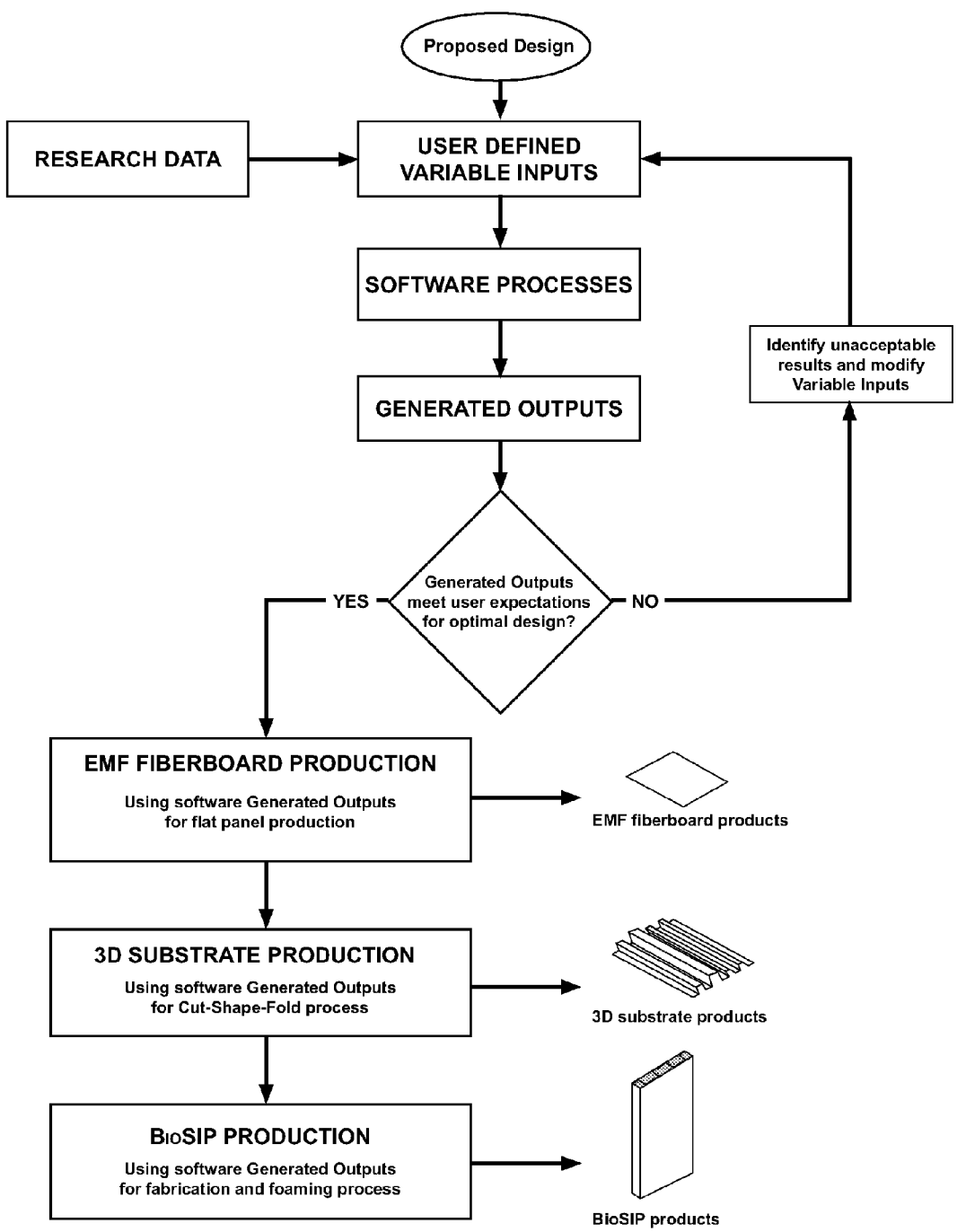
FIG. 18 is flow chart for the disclosed software showing a typical series of operations performed using the disclosed software to determine optimal fiberboard, three-dimensional substrate, and three-dimensional SIP designs based on user inputs.

FIG. 18 is flow chart for the disclosed software showing a typical series of operations performed using the disclosed software to determine optimal fiberboard, three-dimensional substrate, and three-dimensional SIP designs based on user inputs (see Appendix I for examples). As illustrated, user defined variable inputs are derived from a proposed design and research data. The user defined variable inputs are inputs for the software processes which are performed to yield the generated outputs. The generated outputs are examined to determine whether or not they meet user expectations for optimal design. If not, the unacceptable results are identified and utilized to modify the user defined variable inputs. Otherwise the generated outputs are utilized in EMF fiberboard production (flat panel production). The generated outputs (as well as the EMF fiberboard) may also be utilized in three-dimensional substrate production (cut-shape-fold process). Finally, the generated outputs (as well as the produced three-dimensional substrate) may be utilized in three-dimensional SIP production (including fabrication and foaming processes).

Figure 19:
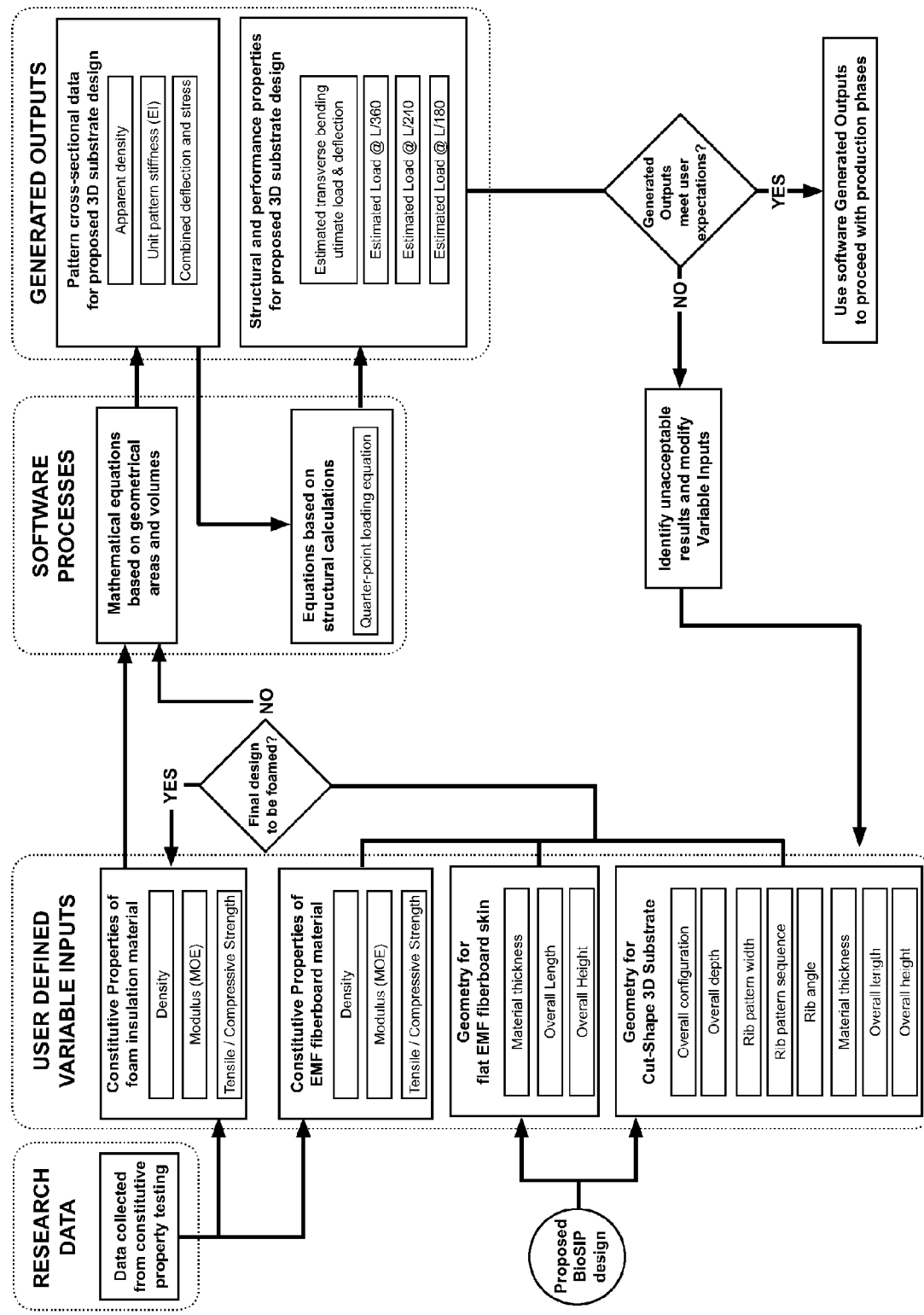
FIG. 19 is a sample flow chart for the disclosed software showing the input/process/output considerations used to estimate transverse loading potential of a specific three-dimensional SIP design.
Figure 20:
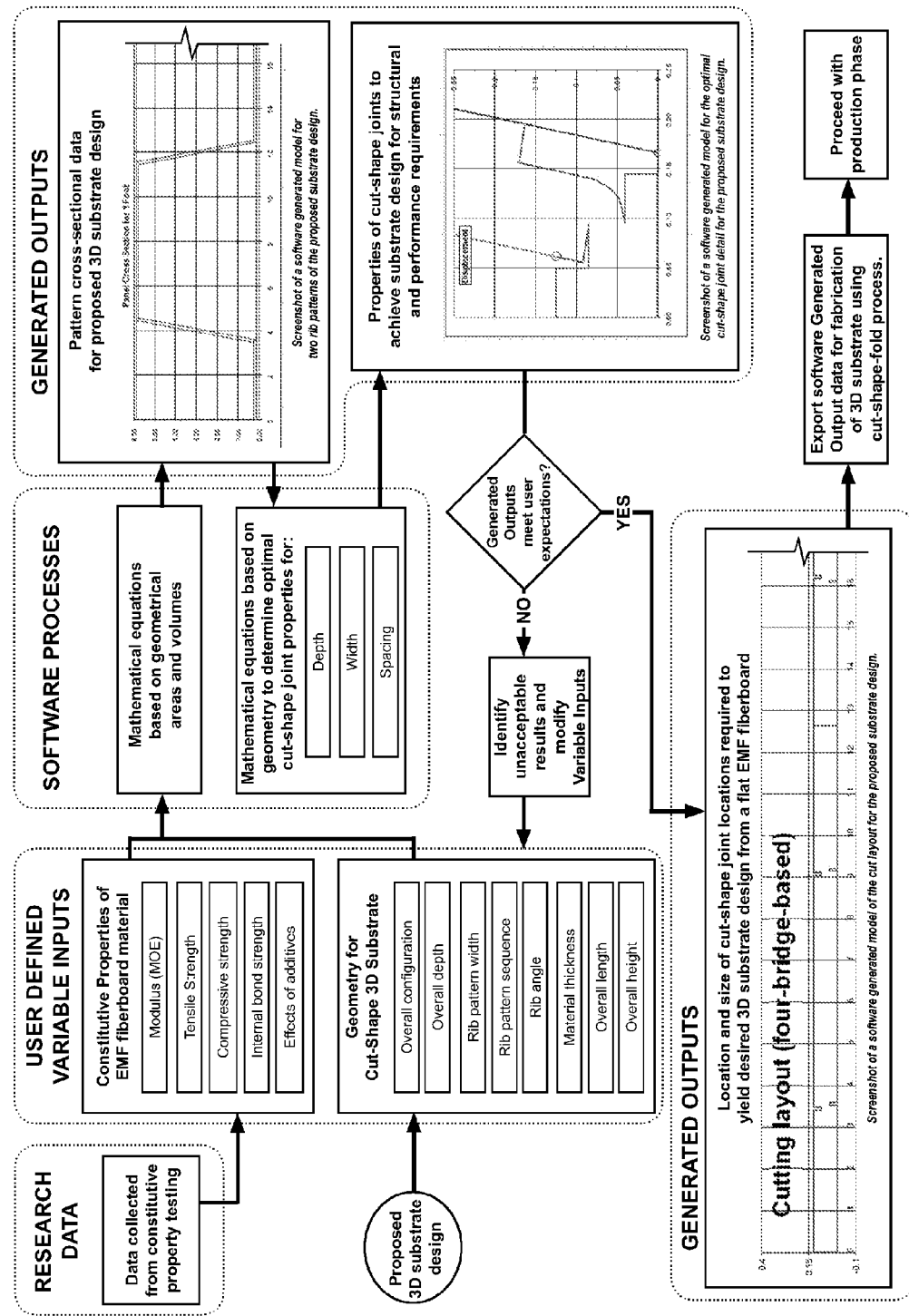
FIG. 20 is a sample flow chart for the disclosed software showing the input/process/output considerations used to determine the optimal cut-shape joint properties and cut-shape joint locations for fabrication of a user-selected three-dimensional substrate design.

FIG. 19 is a sample flow chart for the disclosed software showing the input/process/output considerations used to estimate transverse loading potential of a specific three-dimensional SIP design (see Appendix I for examples). FIG. 20 is a sample flow chart for the disclosed software showing input/process/output considerations used to determine optimal cut-shape joint properties and cut-shape joint locations for fabrication of a user-selected three-dimensional substrate design (see Appendix I for examples).

Figure 21A:
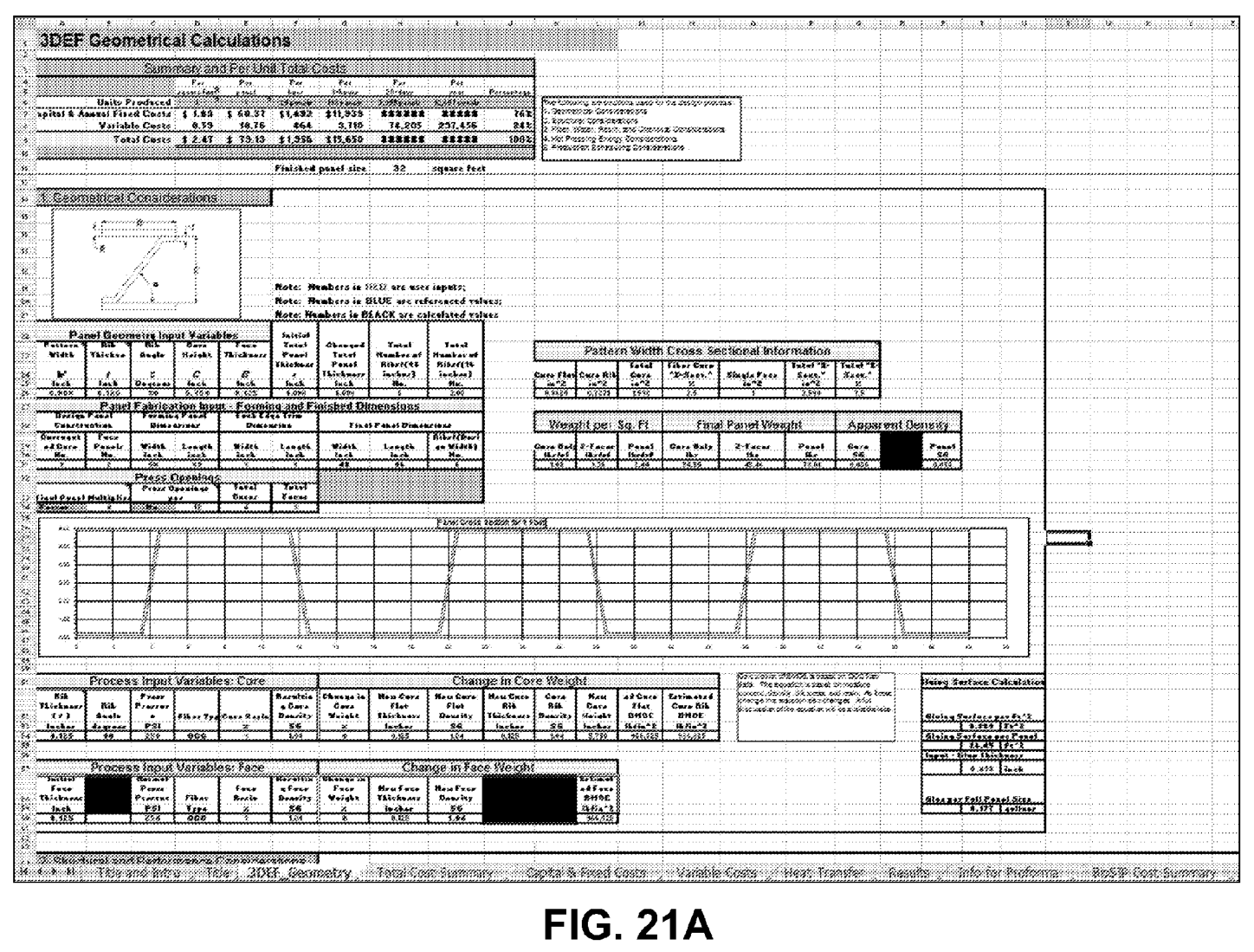
Figure 21B:
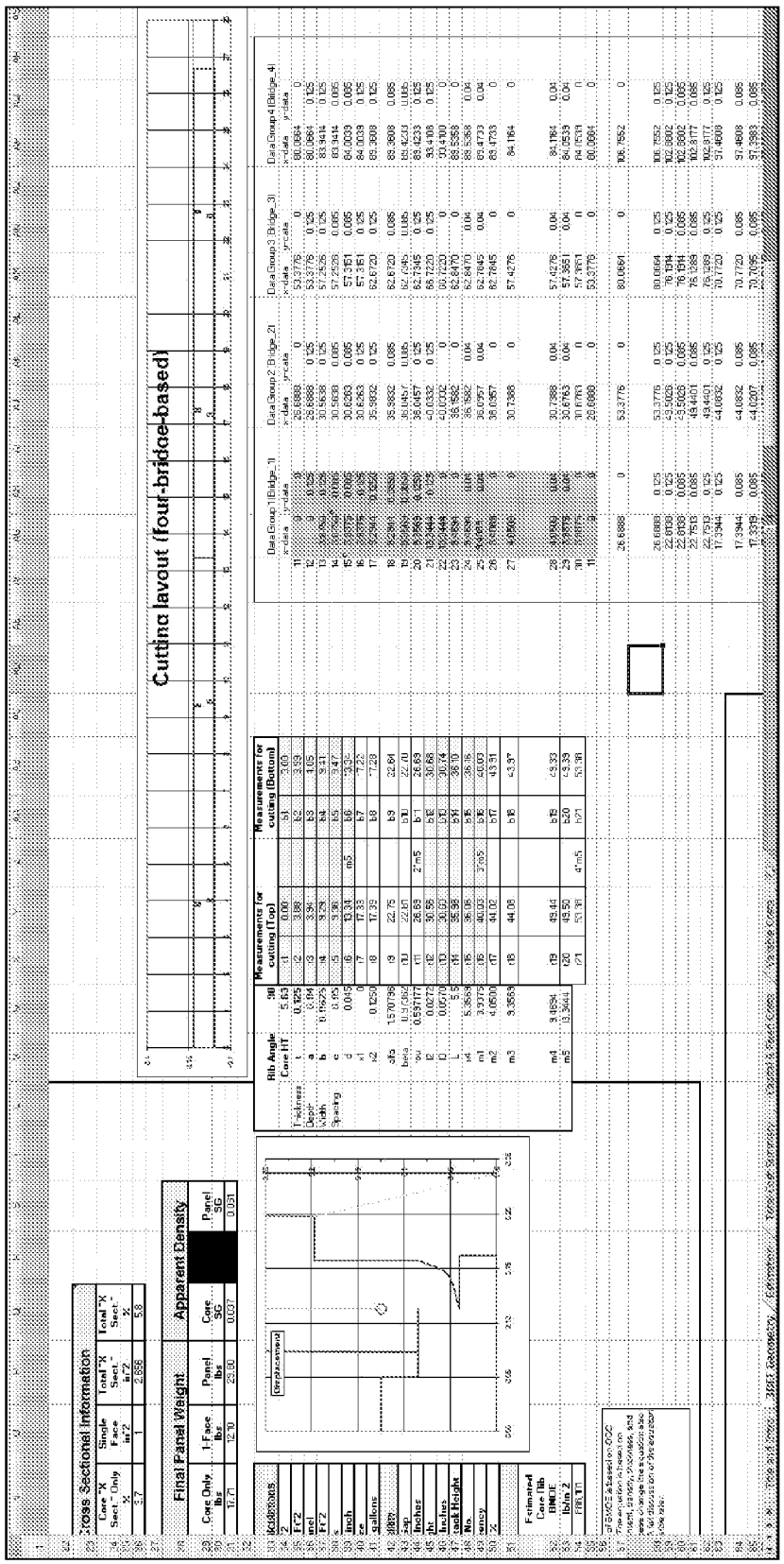
Figure 21C:
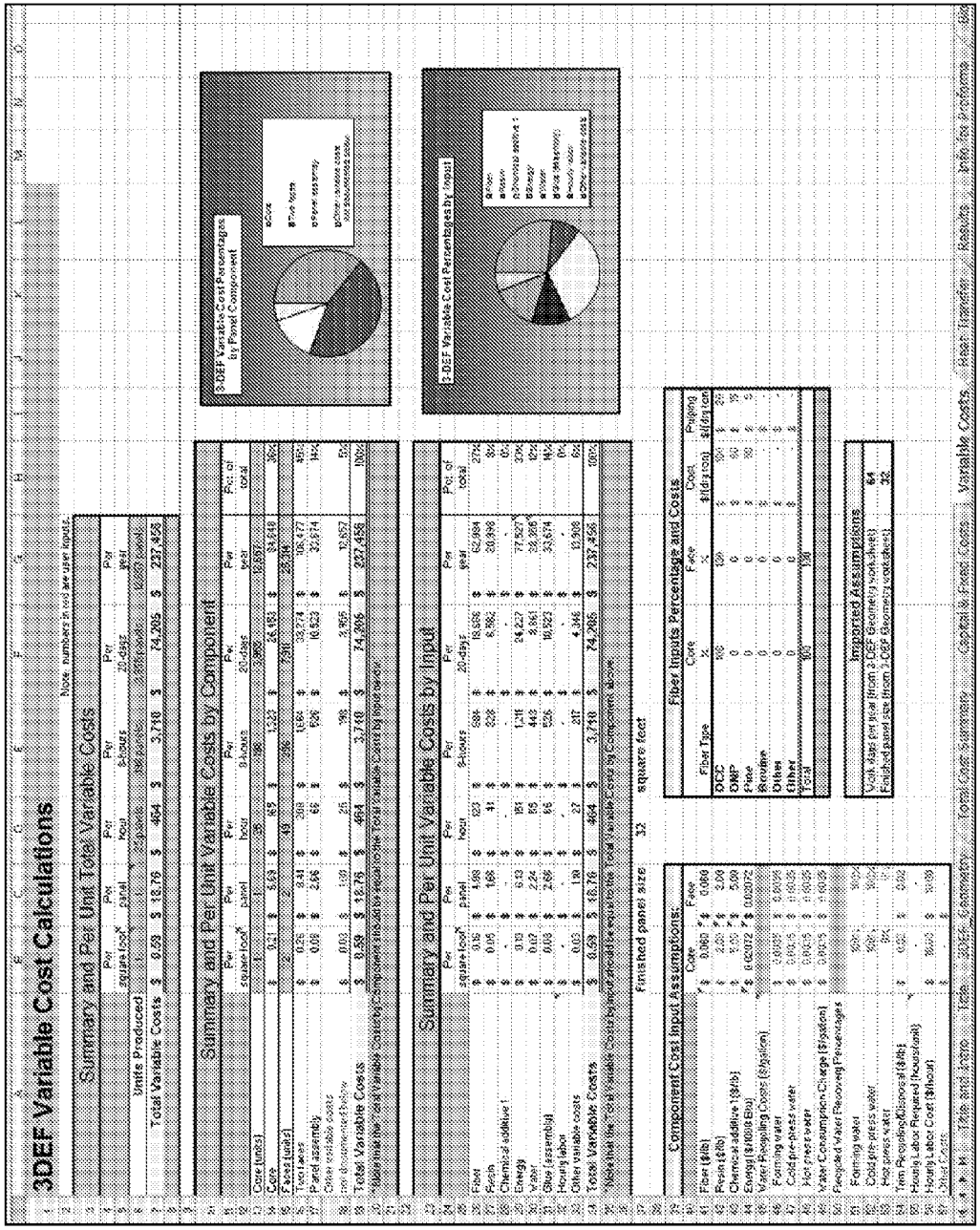

FIGS. 21A-21C are sample display screens that may be displayed by an exemplary implementation of the disclosed software. The display screens provide visual representation of the proposed three-dimensional ESF substrate (FIG. 21A), measurements and templates for particular cuts to be made in the EMF fiberboard to achieve the desired structure (FIG. 21B), and visual graphics analyzing the cost breakdown for the proposed design (FIG. 21C). FIGS. 22A-22C are sample display screens illustrating a sequence of results that may be displayed by an exemplary implementation of the disclosed software.

Figure 23:
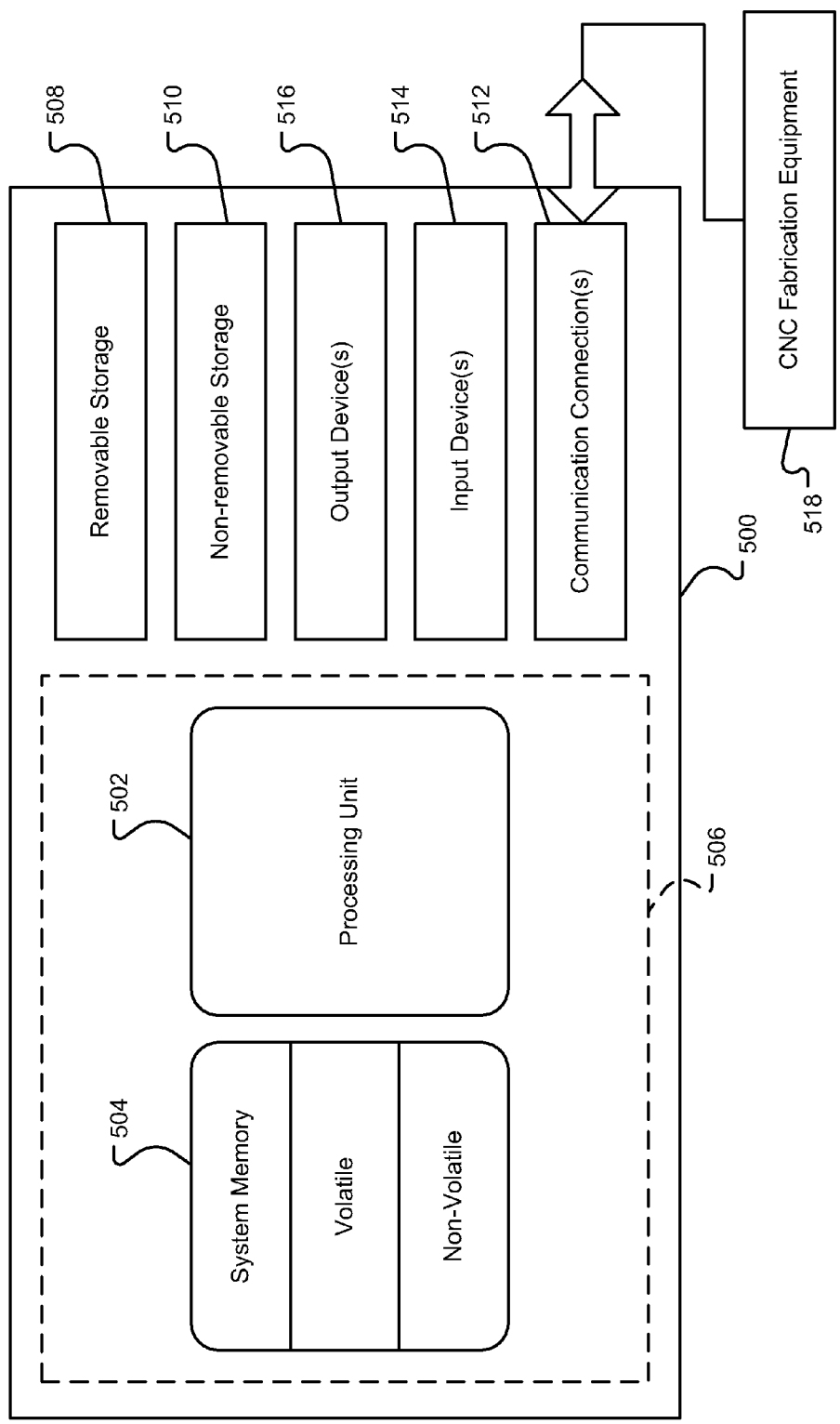
FIG. 23 is a block diagram of an exemplary computing device system for executing the software application discussed herein.

FIG. 23 illustrates an exemplary computer system 500 configured by the EFS configuration software application as described herein. In one implementation, the computer system 500 typically includes at least one processing unit 502 and memory 504. Depending upon the exact configuration and type of the computer system 500, the memory 504 may be volatile (e.g., RAM), non-volatile (e.g., ROM and flash memory), or some combination of both. The most basic configuration of the computer system 500 need include only the processing unit 502 and the memory 504 as indicated by the dashed line 506.

The computer system 500 may further include additional devices for memory storage or retrieval. These devices may be removable storage devices 508 or non-removable storage devices 510, for example, memory cards, magnetic disk drives, magnetic tape drives, and optical drives for memory storage and retrieval on magnetic and optical media. Non-transitory storage media may include volatile and nonvolatile media, both removable and non-removable, and may be provided in any of a number of configurations, for example, RAM, ROM, EEPROM, flash memory, CD-ROM, DVD, or other optical storage medium, magnetic cassettes, magnetic tape, magnetic disk, or other magnetic storage device, or any other memory technology or medium that can be used to store data and can be accessed by the processing unit 502. Additionally, the computer system 500 may execute the software application for EFS configuration as discussed above to control one or more pieces of CNC fabrication equipment and/or components of a CNC fabrication system 518 in order to direct CNC fabrication. The one or more processing units 502 may implement such a software application by executing one or more instructions, for example, computer readable instructions, data structures, and program modules, stored in the one or more non-transitory storage media.

The computer system 500 may also have one or more communication interfaces 512 that allow the system 500 to communicate with other devices. The communication interface 512 may be connected with a network. The network may be a local area network (LAN), a wide area network (WAN), a telephone network, a cable network, an optical network, the Internet, a direct wired connection, a wireless network, e.g., radio frequency, infrared, microwave, or acoustic, or other networks enabling the transfer of data between devices. Data is generally transmitted to and from the communication interface 512 over the network via a modulated data signal, e.g., a carrier wave or other transport medium. A modulated data signal is an electromagnetic signal with characteristics that can be set or changed in such a manner as to encode data within the signal.

The computer system 500 may further have a variety of busses for input devices 514 and output devices 516. Exemplary input devices 514 may include a keyboard, a mouse, a tablet, barcode readers, touch pads, track pads, numeric keypads, track balls, microphones, and/or a touch screen device. Exemplary output devices 516 may include a display monitor, printer, and speakers. Such input devices 514 and output devices 516 may be integrated with the computer system 500 or they may be connected to the computer system 500 via wires or wirelessly, e.g., via IEEE 802.11 or Bluetooth protocol. These integrated or peripheral input and output devices are generally well known and are not further discussed herein. Other functions, for example, handling network communication transactions, may be performed by an operating system in the nonvolatile memory 504 of the computer system 500.

Figure 24:
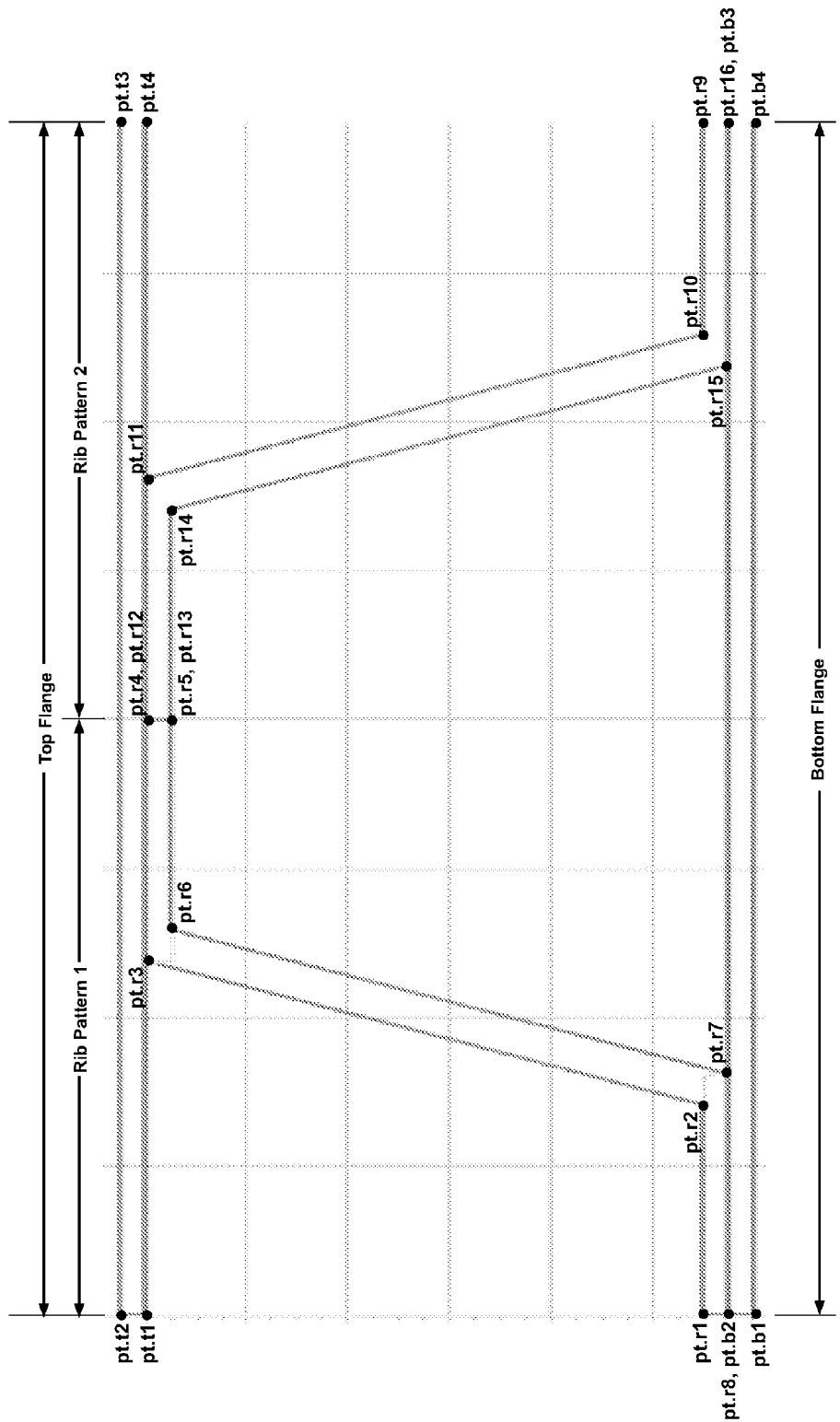
FIG. 24 is a diagram illustrating an exemplary three-dimensional SIP configuration for which the disclosed software will determine optimal cut-shape joint properties and cut-shape joint locations for fabrication.
Figure 25:
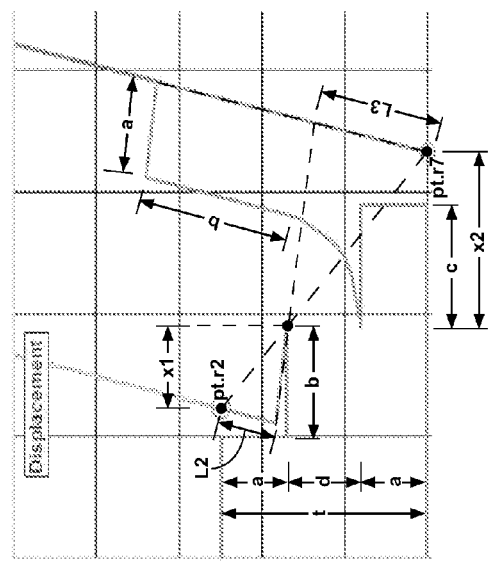
FIG. 25 is a diagram illustrating one of the folds for the exemplary three-dimensional SIP configuration for which the disclosed software will determine optimal cut-shape joint properties and cut-shape joint locations for fabrication.
Figure 26:
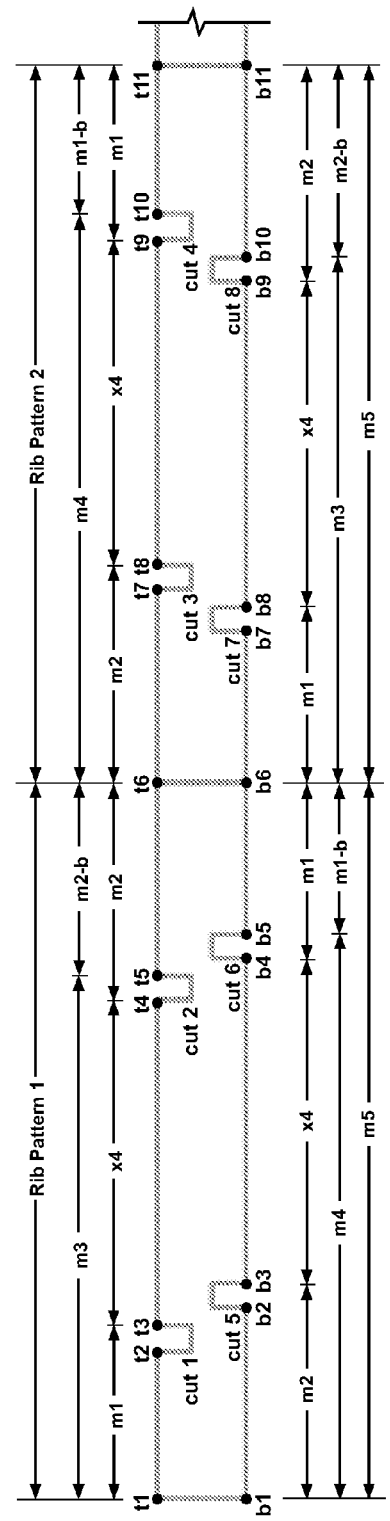
FIG. 26 is a diagram illustrating optimal cut-shape joint properties and cut-shape joint locations for fabrication determined by the disclosed software for the exemplary three-dimensional SIP configuration.
Figure 27:
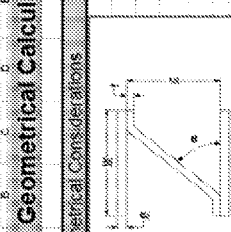
Figure 28:
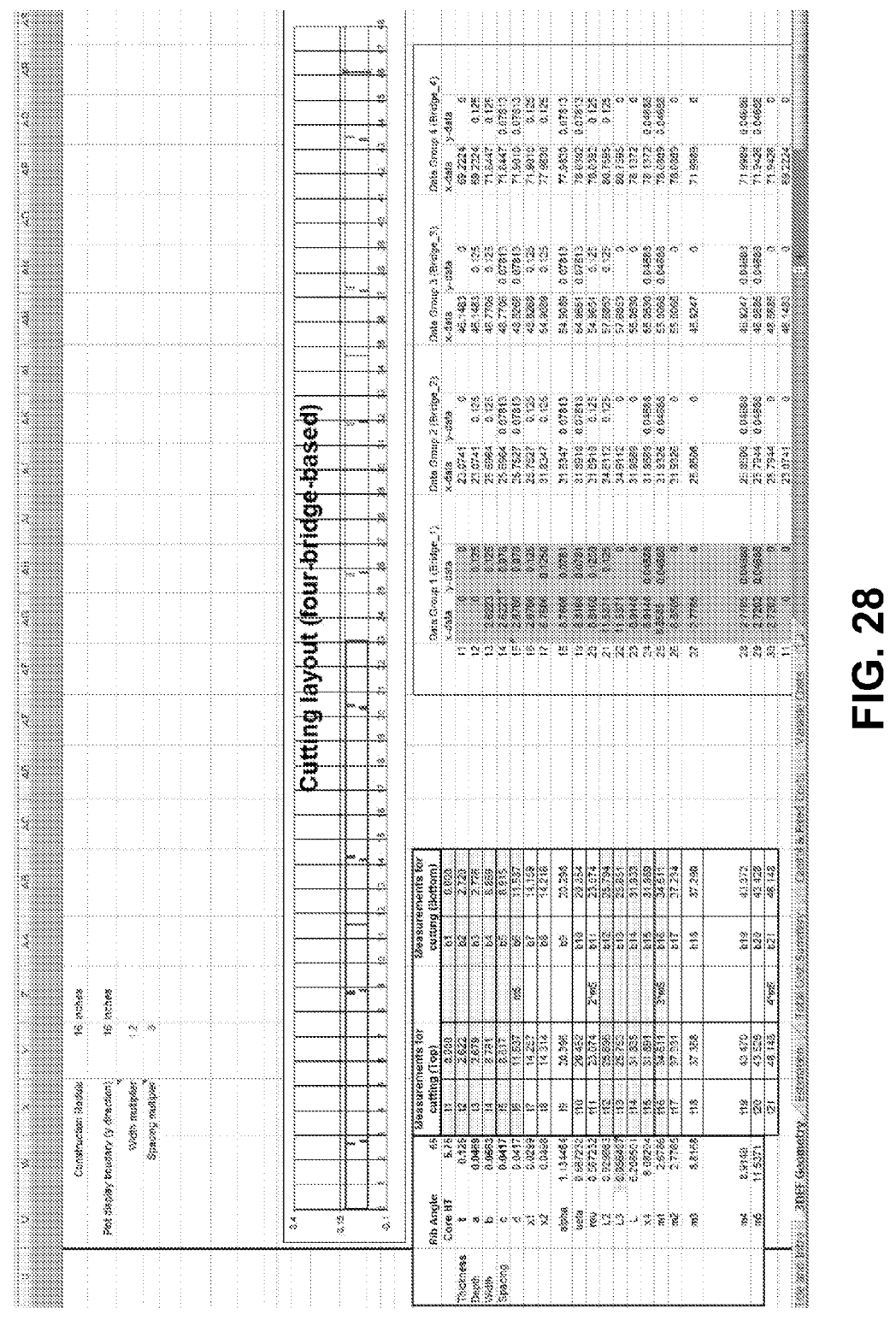

FIG. 24 illustrates an example three-dimensional SIP configuration for which the disclosed software will determine optimal cut-shape joint properties and cut-shape joint locations for fabrication. FIG. 25 illustrates one of the folds for the example three-dimensional SIP configuration for which the disclosed software will determine optimal cut-shape joint properties and cut-shape joint locations for fabrication. FIG. 26 illustrates optimal cut-shape joint properties and cut-shape joint locations (see Appendix I for examples) for fabrication determined by the disclosed software for the example three-dimensional SIP configuration. FIGS. 27 and 28 illustrate sample display screens that may be displayed by an example implementation of the disclosed software determining the optimal cut-shape joint properties and cut-shape joint locations (see Appendix I for examples) for fabrication for the example three-dimensional SIP configuration.

The technology described herein may be at least partially implemented as logical operations and/or modules in one or more systems. The logical operations may be implemented as a sequence of processor-implemented steps executing in one or more computer systems and as interconnected machine or circuit modules within one or more computer systems. Likewise, the descriptions of various component modules may be provided in terms of operations executed or effected by the modules. The resulting implementation is a matter of choice, dependent on the performance requirements of the underlying system implementing the described technology. Accordingly, the logical operations making up the embodiments of the technology described herein may be referred to variously as operations, steps, objects, engines, or modules. Furthermore, it should be understood that logical operations may be performed in any order, unless explicitly claimed otherwise or a specific order is inherently necessitated by the claim language.

In some implementations, articles of manufacture may be provided as computer program products that cause the instantiation of operations on a computer system to implement one or more portions of the disclosure. One implementation of a computer program product provides a computer program storage medium readable by a computer system and encoding a computer program. It should further be understood that the described technology may be employed in special purpose devices independent of a personal computer.

The above specification, examples and data provide a complete description of the structure and use of example embodiments of the disclosure. Although various embodiments of the disclosure have been described above with a certain degree of particularity, or with reference to one or more individual embodiments, those skilled in the art could make numerous alterations to the disclosed embodiments without departing from the spirit or scope of this disclosure. Other embodiments are therefore contemplated. It is intended that all matter contained in the above description and shown in the accompanying drawings shall be interpreted as illustrative only of particular embodiments and not limiting. Changes in detail or structure may be made without departing from the basic elements of the disclosure as defined in the following claims.

What is claimed is:

1. A method performed by a computer system having a non-transitory, machine-readable memory and a processor for creating control values for controlling a computer numeric control (CNC) cutting device to cut a flat fiberboard sheet for configuration as a three-dimensional, engineered, shaped building panel, the method comprising:

receiving within the computer system a first input of a plurality of structural properties of the flat fiberboard sheet-as a first set of variable values;

receiving within the computer system a second input of a plurality of physical and geometric properties of the three-dimensional engineered shaped building panel configuration as a second set of variable values;

storing the first set of variable values and the second set of variable values in the memory;

calculating with the processor structural and performance properties of the three-dimensional, engineered, shaped panel using a set of equations that incorporate a plurality of variable values from the first set of variable values and the second set of variable values;

calculating with the processor respective positions, widths, depths, and lengths for both a first cut on a top surface of the flat fiberboard sheet that extends to a first depth short of a bottom surface of the flat fiberboard sheet and a second cut on the bottom surface of the flat fiberboard sheet parallel to and spaced apart at a predetermined distance from the first cut that extends to a second depth short of the top surface of the flat fiberboard sheet using a set of equations that incorporate one or more variable values from the second set of variable values, wherein the positions of the first and second cuts are calculated to form a single hinged fold joint along the flat fiberboard sheet that fits the calculated structural and performance properties required to form the three-dimensional, engineered, shaped building panel configuration;

generating with the processor a set of control values corresponding to the respective positions, widths, depths, and lengths of the first cut and the second cut in a format configured to provide control instructions to the CNC cutting device; and outputting the set of control values.

2. The method of claim 1, wherein the computer system is further connected with and configured to control the CNC cutting device and the method further comprises controlling the CNC cutting device with the set of control values to cut the first cut and cut the second cut.

3. A computer program product for configuring a computer system to create control values for controlling a computer numeric control (CNC) cutting device to cut a flat fiberboard sheet for configuration as a three-dimensional, engineered, shaped building panel, the computer program product comprising:

a first set of instructions, stored in at least one non-transitory storage medium, executable by at least one computer processing unit, and configured to retrieve from a memory a first set of variable values corresponding to a plurality of structural properties of the flat fiberboard sheet;

a second set of instructions stored in the at least one non-transitory storage medium, executable by at least one computer processing unit, and configured to retrieve from a memory a second set of variable values corresponding to a plurality of physical and geometric properties of the three-dimensional, engineered, shaped building panel configuration;

a third set of instructions stored in the at least one non-transitory storage medium, executable by at least one computer processing unit, and configured to calculate a plurality of structural and performance requirements for a three-dimensional engineered shaped panel configuration using a set of equations that incorporate a plurality of variable values from the first set of variable values and the second set of variable values;

a fourth set of instructions, stored in the at least one non-transitory storage medium, executable by the at least one processing unit to calculate respective positions, widths, depths, and lengths for both a first cut on a top surface of the fiberboard sheet that extends to a first depth short of a bottom surface of the flat fiberboard sheet and a second cut on the bottom surface of the flat fiberboard sheet parallel to and spaced apart at a predetermined distance from the first cut that extends to a second depth short of the top surface of the flat fiberboard sheet using a set of equations that incorporate one or more variable values from the second set of variable values, wherein the positions of the first and second cuts are calculated to form a single hinged fold joint along the flat fiberboard sheet that fits the calculated structural and performance properties required to form the three-dimensional, engineered, shaped building panel configuration;

a fifth set of instructions stored in the at least one non-transitory storage medium, executable by at least one computer processing unit, and configured to generate a set of control values corresponding to the respective positions, widths, depths, and lengths of the first cut and the second cut in a format configured to provide control instructions to the CNC cutting device; and a sixth set of instructions stored in the at least one non-transitory storage medium, executable by at least one computer processing unit, and configured to output the set of control values.

4. The computer program product of claim 3, further comprising a seventh set of instructions, stored in the at least one non-transitory storage medium, executable by the at least one processing unit, and configured to control the CNC cutting device with the set of control values to cut the first cut and cut the second cut.

5. The computer program product of claim 3, wherein the second set of variable values for the physical and geometric properties includes a value for a rib angle that defines a desired angular relationship between a first portion of the flat fiberboard sheet on a first lateral side of the single hinged fold joint and a second portion of the flat fiberboard sheet on a second lateral side of the single hinged fold joint when the flat fiberboard sheet is folded to form the three-dimensional engineered shaped panel configuration.

6. The method of claim 1, wherein the second set of variable values for the physical and geometric properties includes a value for a rib angle that defines a desired angular relationship between a first portion of the flat fiberboard sheet on a first lateral side of the single hinged fold joint and a second portion of the flat fiberboard sheet on a second lateral side of the single hinged fold joint when the flat fiberboard sheet is folded to form the three-dimensional engineered shaped panel configuration.

* * * * *